(12) United States Patent
Matsutori et al.

(10) Patent No.: US 7,726,490 B2
(45) Date of Patent: Jun. 1, 2010

(54) LID UNIT THIN PLATE SUPPORTING CONTAINER

(75) Inventors: Chiaki Matsutori, Shisui-machi (JP); Tadahiro Obayashi, Shisui-machi (JP); Takaharu Oyama, Shisui-machi (JP)

(73) Assignee: Miraial Co., Ltd. (JP)

( * ) Notice: Subject to any disclaimer, the term of this patent is extended or adjusted under 35 U.S.C. 154(b) by 61 days.

(21) Appl. No.: 12/222,681

(22) Filed: Aug. 14, 2008

(65) Prior Publication Data
US 2009/0038986 A1 Feb. 12, 2009

Related U.S. Application Data

(60) Division of application No. 11/087,048, filed on Mar. 23, 2005, now Pat. No. 7,455,181, which is a continuation-in-part of application No. 10/768,031, filed on Feb. 2, 2004, now abandoned.

(30) Foreign Application Priority Data

| May 19, 2003 | (JP) | ............................... 2003-140402 |
| Sep. 5, 2003 | (JP) | ............................... 2003-314640 |

(51) Int. Cl.
*B65D 85/30* (2006.01)
(52) U.S. Cl. .................... 206/711; 206/454
(58) Field of Classification Search ............... 206/454, 206/710, 711; 211/41.18; 220/323; 118/500; 292/66; 414/217, 292, 403
See application file for complete search history.

(56) References Cited

U.S. PATENT DOCUMENTS

| 4,043,451 A * | 8/1977 | Johnson ........................ 206/711 |
| 4,817,799 A | 4/1989 | Gregerson et al. ........... 206/445 |
| 5,207,324 A * | 5/1993 | Kos ............................. 206/711 |
| 5,555,981 A * | 9/1996 | Gregerson .................... 206/711 |
| 5,711,427 A | 1/1998 | Nyseth ......................... 206/710 |
| 5,931,512 A | 8/1999 | Fan et al. ....................... 292/66 |
| 5,957,292 A | 9/1999 | Mikkelsen et al. ........... 206/710 |

(Continued)

FOREIGN PATENT DOCUMENTS

EP         1434256 A        6/2004

(Continued)

*Primary Examiner*—Luan K Bui
(74) *Attorney, Agent, or Firm*—Bacon & Thomas, PLLC

(57) ABSTRACT

The present invention is directed to a lid unit having a latching mechanism for firmly fixing the lid unit to a container body for containing semiconductor wafers and the like, which latching mechanism can be easily disassembled for cleaning and drying of its components, and to a wafer presser for retaining the semiconductor wafers in position when the container is shaken. The latching mechanism includes a locking member which, when projected, secures the lid unit to the container body; an actuator for moving the locking member between projected and retracted positions; a tip-side cam for pressing a tip portion of the locking member in one direction relative to the lid unit when the locking member is projected by the actuator; a base-end lower cam for pressing a base-end of the locking member in a second direction, opposite the one direction; and a base-end upper cam and a cam projection follower for pressing the base-end in the second direction. The wafer presser is supported by a supporting projection bar formed with its ends thinner than its center portion.

13 Claims, 26 Drawing Sheets

U.S. PATENT DOCUMENTS

| | | |
|---|---|---|
| 6,082,540 A | 7/2000 | Krampotich et al. ........ 206/445 |
| 6,267,245 B1 * | 7/2001 | Bores et al. ................. 206/711 |
| 6,273,261 B1 | 8/2001 | Hosoi ......................... 206/711 |
| 6,622,883 B1 | 9/2003 | Wu et al. .................... 220/323 |
| 7,383,955 B2 * | 6/2008 | Matsutori et al. ........... 206/711 |
| 2002/0106266 A1 | 8/2002 | Bonora et al. ............... 414/217 |
| 2002/0134784 A1 | 9/2002 | Hsieh et al. ................. 220/323 |
| 2003/0047476 A1 | 3/2003 | Wu et al. .................... 206/454 |
| 2005/0115865 A1 | 6/2005 | Matsutori et al. ........... 206/710 |

FOREIGN PATENT DOCUMENTS

| | | |
|---|---|---|
| GB | 2290414 | 12/1995 |
| WO | 90/14273 | 11/1990 |
| WO | 99/06305 | 2/1999 |
| WO | 00/02798 | 1/2000 |

* cited by examiner

LID UNIT THIN PLATE SUPPORTING CONTAINER

CROSS-REFERENCE TO RELATED APPLICATION

This application is a divisional of U.S. application Ser. No. 11/087,048, filed Mar. 23, 2005, U.S. Pat. No. 7,455,181 which is a continuation-in-part of U.S. application Ser. No. 10/768,031, filed Feb. 2, 2004, abandoned. This application also claims, under 35 USC 119, priority of Japanese Application No. 2003-140402 filed May 19, 2003 and Japanese Application No. 2003-314640 filed Sep. 5, 2003. The teachings of said U.S. and Japanese applications are incorporated by reference herein in their entireties, inclusive of their specifications, claims and drawings.

BACKGROUND OF THE INVENTION

1. Field of the Invention

The present invention relates to a lid unit for a thin plate supporting container for housing a thin plate such as a semiconductor wafer, a storage disk, or a liquid crystal glass substrate. The container may be used in storing, transporting, manufacturing and the like.

2. Related Background Art

Containers for housing thin plates such as semiconductor wafers for storage and transport are generally known.

The thin plate supporting container is constructed mainly of a container body and a lid unit for closing the upper opening of the container body. In the container body, a member for supporting thin plates such as semiconductor wafers is provided. Such a thin plate supporting container must be capable of maintaining a clean interior in order to prevent contamination of the surfaces of the thin plates housed inside. Consequently, the container is sealed. To be specific, a lid unit is fixed on the container body to airtightly seal the opening of the container body. Various structures are known for fixing the lid unit on the container body.

The thin plate supporting container transported to a semiconductor manufacturing factory or the like is placed on a manufacturing line and the lid unit is automatically removed by a dedicated apparatus.

An example of a lid unit adapted to such a dedicated apparatus is disclosed in Japanese Patent Application Laid-Open No. 2001-512288 as including, as shown in FIG. 2, a body 2, a cam member 3, a latch arm 4, and a fulcrum 5.

The cam member 3 is rotatably attached to the body 2 and includes a cam portion 6. In the cam portion 6, is a coupling opening 7 having the shape of an arched elongated hole.

At the base end of the latch arm 4, an S-shaped cam follower 8 is provided. The S-shaped cam follower 8 is received and held in the coupling opening 7.

A fulcrum 5 is provided in the form of a projection that supports the latch arm 4.

When the cam member 3 rotates, the S-shaped cam follower 8 in the coupling opening 7 is lifted upward while being moved to the right in the diagram. Consequently, the latch arm 4 swings around the fulcrum 5 while being extended from the body 2 and the tip of the latch arm 4 is pressed downward.

At this time, the tip of the latch arm 4 is inserted into a hole in the container body. By being pressed downward, the tip of the latch arm 4 presses the lid unit against the container body so as to fix the lid unit to the container body.

However, since the base end of the latch arm 4 is lifted upward while being captured by the cam member 3 and extended, in pivoting the latch arm 4 about the fulcrum 5 as a center, in the sense of a lever action, the base end of the latch arm 4 is the power point, and the tip is the point of force application. Accordingly, to press the lid unit 1 strongly against the container body in order to increase air tightness within the container body, it is necessary to strongly press the tip of the latch arm 4 against the rim of the receiving hole or recess in the container body. For this purpose, the strength of the cam member 3 and the latch arm 4 must be increased to allow for an increase in the distance between the tip of the latch arm 4 and the fulcrum 5.

On the other hand, by moving the fulcrum 5 toward the tip of the latch arm 4, the tip of the latch arm 4 can be more strongly pressed against the rim of the hole in the container body side without increasing the strength of the cam member 3 and the latch arm 4. However, when the fulcrum 5 is moved toward the tip side, the distance through which the base end of the latch arm 4 is lifted upward becomes longer. If the distance to lift is thus increased, a problem occurs in that the lid unit 1 must be made thicker.

On the inner face of the lid unit, a wafer presser is usually provided. The wafer presser supports semiconductor wafers housed in the container body by pressing the semiconductor wafers from above. As the diameter of a semiconductor wafer increases, the support for the semiconductor wafer must also be increased. Accordingly, reactive force from the semiconductor wafer which is received by the wafer presser increases. Also, as the number of housed semiconductor wafers increases, reactive force from the semiconductor wafers increases. As a result, the lid unit and the wafer retainer are outwardly deflected whereby the pressing force in the center portion of the wafer presser is weakened and, if vibration is received from the outside, the semiconductor wafers rotate (cant).

SUMMARY OF THE INVENTION

Accordingly, the present invention has as its object provision of a lid unit for a thin plate supporting container capable of firmly supporting thin plates with strong force without increase in size and of preventing a thin plate from rotating even when vibrated.

According to a first aspect of the invention, there is provided a lid unit for closing a thin plate supporting container in which a plurality of thin plates are housed and carried, including a simple latching mechanism which can be easily and firmly attached/detached to/from the container body. The latching mechanism includes a locking member which is projected into and retained by the side of the container body; an actuator for moving the locking member between engaged (latching) and disengaged (withdrawn) positions; a tip-side cam for biasing a tip portion of the locking member in a first direction relative to an inner surface of the lid unit with the locking member in its engaged position; and a base-end-side cam for pressing a base portion of the locking member in a second direction, opposite said first direction, with the locking member in its engaged position.

With the above-described structure, when the locking member is moved to its engaged position by the actuator, the tip-side cam presses the tip portion of the locking member in one direction and the base-side cam presses the base portion of the locking member in the opposite direction, whereby the lid unit is fixed to the container body.

The tip-side cam preferably has an oblique surface for pushing the tip side of the locking member in the first direction. Likewise, the base-side cam has an oblique surface for pushing the base portion of the locking member in the opposite direction.

The locking member preferably includes a fulcrum for pivoting the locking member. The fulcrum is preferably located on the tip portion of the locking member. Thus, the locking member pivots about the fulcrum as its pivot point. Since the fulcrum is provided on the tip portion of the locking member, the lid unit can be pressed by a lever action against the container body, with a strong force.

The latching mechanism is preferably easily detachable and easily disassembled into its component parts. Accordingly, for cleaning, the latching mechanism can be detached and disassembled into its component parts for separate cleaning of each of the component parts. Thus, the component parts can be better cleaned and promptly dried.

In another aspect of the invention, the lid unit includes a thin plate presser for supporting the thin plates housed within the container body, wherein the thin plate presser has supporting pieces disposed spaced around the periphery of a thin plate and alternately contacting the opposing sides in a thin plate around a segment of its periphery.

In yet another preferred embodiment of the invention, the thin plate presser includes two contact pieces having alternately disposed supporting pieces as described above and elastic support plates for elastically supporting the contact pieces, with elastic support plates attached between and at both ends of the contact pieces, wherein the elastic support plates between the contact pieces support the contact pieces in a state where the elastic support plates are slightly spaced from the inner surface of the lid unit ("floating"). Because the contact pieces are supported slightly floating off an attachment surface, a thin plate is usually supported by a relatively small force. Therefore, when a large shock is received, for example if the thin plate supporting container is dropped by mistake, the elastic supporting plate between the contact pieces comes into contact with a supporting surface and thereby more strongly supports the contact pieces. In this manner, a thin plate is protected from a strong shock.

The invention optionally further includes a lid unit holder which fits over the lid unit to more firmly secure the lid unit to the container body. With the lid unit holder attached, even if a strong shock is received due to dropping or the like, the lid unit will not separate from the container body.

In another embodiment the thin plate presser has a plurality of contact pieces which are disposed in parallel, with each contacting and securing a respective one of the plurality of thin plates. In this embodiment the parallel contact pieces are disposed so that the contact piece positioned in a center portion project further toward the thin plates than the contact pieces positioned on opposing sides of the center portion. Such structure compensates for deflection of the lid unit so as to support the thin plates with uniform force.

The thin plate presser preferably includes at least one end support fixed to the inner surface of the lid unit and a plurality of elastic support plates each having one end fixed to the end support and an opposite end fixed to and supporting one end of a contact piece. The elastic support plates are formed so that the contact pieces positioned in a center portion project further toward the thin plates than the contact pieces positioned on opposing sides of the center portion. Thus, the elastic support plates compensate for deflection of the lid unit and the thin plates are thereby supported with uniform force.

In a preferred embodiment the thin plate presser includes an end support fixed to the inner rear surface of the lid unit; a plurality of first elastic support plates each fixed at its one end to the end support and at its other end to one end of a contact piece; and a plurality of second elastic support plates each fixed to the other end of the contact piece and in contact with the inner surface of the lid unit. The first elastic support plates and/or the second elastic support plates are formed so that the contact pieces positioned in a center portion project further toward the thin plates than the contact pieces positioned on opposing sides of the center portion. In this manner, the thin plate presser compensates for deflection of the lid unit so that each of thin plates is supported with uniform force.

In another embodiment, the thin plate presser includes an end support fixed to the inner surface of the lid unit; a plurality of first elastic support plates extending from one end supported by the end support to opposite ends each supporting one end of a contact piece; a plurality of second elastic support plates each supporting the other end of each of the contact pieces and contacting the inner surface of the lid unit; and a supporting projection bar provided on the inner surface of the lid unit and in contact with and supporting the second elastic support plates; and wherein the supporting projection bar and/or the second elastic support plates are formed so that centrally positioned contact pieces project toward the thin plates further than the contact pieces positioned on opposing sides of the centrally positioned contact pieces. Thus, this embodiment also compensates for deflection of the lid unit so that the thin plates are supported with uniform force.

Each of the contact pieces preferably has a V-shaped groove having an angle of 40° to 44° for receiving the periphery of a thin plate, and for supporting the thin plate with reliability.

In yet another embodiment, the thin plate presser includes two end supports fixed to an inner surface of the lid unit; a plurality of contact pieces which are disposed to contact and hold the periphery of a thin plate; two elastic support plates each supported at base end by a respective end support and extending to an outer end which is fixed to an end of a contact piece of said plurality; a connecting plate for connecting and supporting the plurality of contact pieces; and a supporting member for preventing the connecting plate from deviation along the inner surface of the lid unit, while permitting movement of the connecting plate in a direction perpendicular to the inner surface of the lid unit. With this structure outer ends of contact pieces of said plurality of contact pieces are supported by the elastic support plates, the inner end of each of the contact pieces is supported by the connecting plate, and the connecting plate, in turn, is supported by the supporting member, thereby supporting the periphery of a thin plate with reliability. Particularly, because the contact pieces are supported by the connecting plate which, in turn, is supported by the supporting member, each of the contact pieces can be prevented from deviation of its position in a direction parallel to the inner surface of the lid unit.

The supporting member preferably has supporting ribs for supporting each of the connecting plates so as to prevent deviation in position thereof along (parallel to) the inner surface of the lid unit.

The supporting member preferably has a fitting projection which is seated in a hole formed in the connecting plate, thereby preventing deviation along the inner surface of the lid unit while permitting movement in a direction perpendicular to the inner surface of the lid unit. Thus, contact pieces can be prevented from deviation in their positions parallel to the inner surface of the lid unit, and a thin plate can be supported with reliability.

Preferably, the elastic force of the connecting plate supporting the contact piece is stronger than elastic force of the elastic support plate supporting the contact piece. By increasing the elastic force of the connecting plate supporting the contact piece relative to that of the elastic support plate, there is no difference between the elastic force (supporting force) at the center portion of the thin plate presser and that at the end portions. The forces pressing the thin plates are wholly equalized and the thin plates are supported with greater reliability.

The contact pieces carried by the thin plate presser which come into direct contact with and support the plurality of thin plates preferably have V-shaped grooves which seat on the periphery of a thin plate, and have an angle of inclination of from 20° to 60°. When the angle of inclination of the V-shaped groove is 20° to 60°, the periphery of the thin plate is supported by seating within the V-shaped groove. Further, when the contact piece is separated from the thin plate, the thin plate is smoothly separated without catching within the V-shaped groove. When the inclination angle of the V-shaped groove is less than 20° the contact piece may be caught within the V-shaped groove when an attempt is made to pull out the thin plate. When the inclination angle of the V-shaped groove is more than 60°, the thin plate is not sufficiently snug within the V-shaped groove of the contact piece to resist canting (rotation).

Preferably, there is a gap between the peripheral surface of the thin plate and the bottom of the V-shaped groove when the thin plate is fully seated in the V-shaped groove. Because the periphery of the thin plate does not contact the bottom of the V-shaped groove the thin plate is strongly pressed against the inclined surface of the V-shaped groove.

In another preferred embodiment of the invention, the contact pieces have V-shaped grooves with the same angle of inclination as the angle of the edge (bevel) of the periphery of the thin plate, and there is a gap between the periphery of the thin plate and the bottom of the V-shaped groove when the thin plate is fully seated in the V-shaped groove.

In another preferred embodiment of the invention, the angle of inclination of the V-shaped groove of the contact piece is set to 44°. When the thin plate set having an edge beveled at 44° is seated in a V-shaped groove of the contact piece set to an angle of inclination of 44°, the periphery of the thin plate and the V-shaped groove are aligned and strongly pressed together over a large area of contact.

The lid unit of the invention, as described above, offers the following advantages:

(1) Since the locking member is projected with a lever action, the lid unit can be fixed to the container body with a stronger force.

(2) Since the latching mechanism can be easily disassembled into its component parts, for cleaning the latching mechanism can be detached and disassembled to its component parts and each of the component parts can be individually cleaned and promptly dried.

(3) Since the support points are alternately disposed, the support points alternately come into contact with opposing sides of the periphery of a thin plate and reliably support the periphery.

(4) The contact pieces are supported in such a manner that the contact pieces in the center portion of the array project further toward the thin plates than the contact pieces on opposing sides of the center portion. This structure compensates for deflection of the lid unit so that the thin plates are supported with uniform force.

(5) The elastic support plate may support the contact pieces in the center portion of a parallel array of contact pieces to project further toward the thin plates than the contact pieces on opposing sides of the center portion. Thus, in this manner also, deflection of the lid unit can be compensated for and thin plates can be supported with a uniform force.

(6) In an embodiment with opposing first and second elastic support plates, the first and/or second elastic support plates can be structured so that they cause the contact pieces in the center portion of the parallel array to project further toward the thin plates than the contact pieces on opposing sides of the center portion, thus compensating for deflection of the lid unit and supporting all of the thin plates with a uniform force.

(7) Likewise the supporting projection bar may be structured so that the contact pieces positioned in the center portion of the parallel array project further toward the thin plates than the contact pieces positioned on opposing sides of the center portion.

(8) In an embodiment where in the connecting plate between contact pieces is supported by the supporting member, the contact pieces can be prevented from moving parallel to the inner surface of the lid unit, to support the thin plates with greater reliability.

(9) Further, since the connecting and supporting plates are positioned by the supporting ribs, the contact pieces can be prevented from deviating along (moving parallel to) the inner surface of the lid unit, and a thin plate can be more reliably supported.

(10) Since the fitting projection is seated within a hole formed in the connecting plate, in this manner also the contact pieces can be prevented from deviation along the inner surface of the lid unit, and the thin plates can be supported with reliability.

(11) By increasing the elastic force supporting the contact pieces by the connecting plates, the difference between the force supporting the contact pieces in the center portion of the thin plate presser and that supporting the contact pieces at opposing ends of the thin plate presser is eliminated. Thus, pressing forces on the thin plates can be equalized and the thin plates are reliably supported.

(12) The angle of inclination the V-shaped groove of the contact piece is 20° to 60° so that the periphery of the thin plate is properly seated within the V-shaped groove. As a result, the thin plate can be prevented from canting (rotating). Further, the thin plate seated within the V-shaped groove can be smoothly removed therefrom without catching and it is easy to attach and detach the lid.

(13) Because of a gap between the periphery of the thin plate and the bottom of the V-shaped groove of the contact piece, when the thin plate is seated within the V-shaped groove, the periphery of the thin plate is not in contact with the bottom of the V-shaped groove and the periphery of the thin plate is strongly pressed against the inclined surface of the V-shaped groove. As a result, the thin plate is reliably supported by seating within the V-shaped groove.

(14) Since the contact piece includes a V-shaped groove having the same inclination angle as the angle of the bevel of the periphery of the thin plate, and there is a gap between the periphery of the thin plate and the bottom of the V-shaped groove when the periphery of the thin plate is sealed within the V-shaped groove, the beveled edge of the periphery of the thin plate and the inclined surfaces of the V-shaped groove are aligned and in contact over a large area. Consequently, the periphery of the thin plate is strongly pressed against the V-shaped groove. That is, the periphery of the thin plate can be strongly pressed against the inclined surface of the V-shaped groove without strongly pressing the contact piece against the thin plate. As a result, the thin plate can be reliably supported by the thin plate presser without too strongly pressing the thin plate presser against the thin plates so that canting (rotating) of the thin plates, e.g., due to vibration, can be prevented. Consequently, the thin plates can be reliably supported without too strongly pressing the lid against the container body. This structure eliminates the need to increase lid strength.

(15) In an embodiment wherein the V-shaped groove of the contact piece and the edge bevel of the thin plate both have an angle of 44° they are aligned and in contact over a large area with the same advantages as mentioned above (#14).

DETAILED DESCRIPTION OF THE PREFERRED EMBODIMENTS

Figure 1:
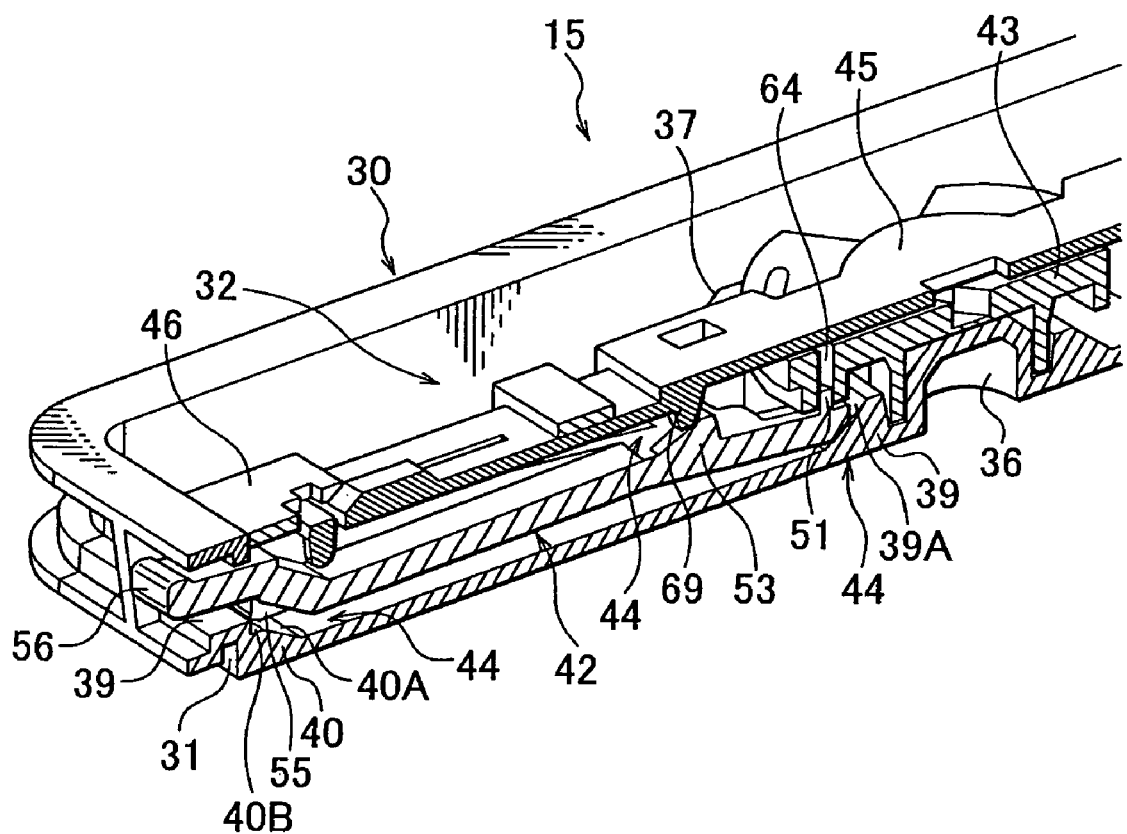
FIG. 1 is a partial perspective view showing a lid unit according to a first embodiment of the invention.
Figure 2:
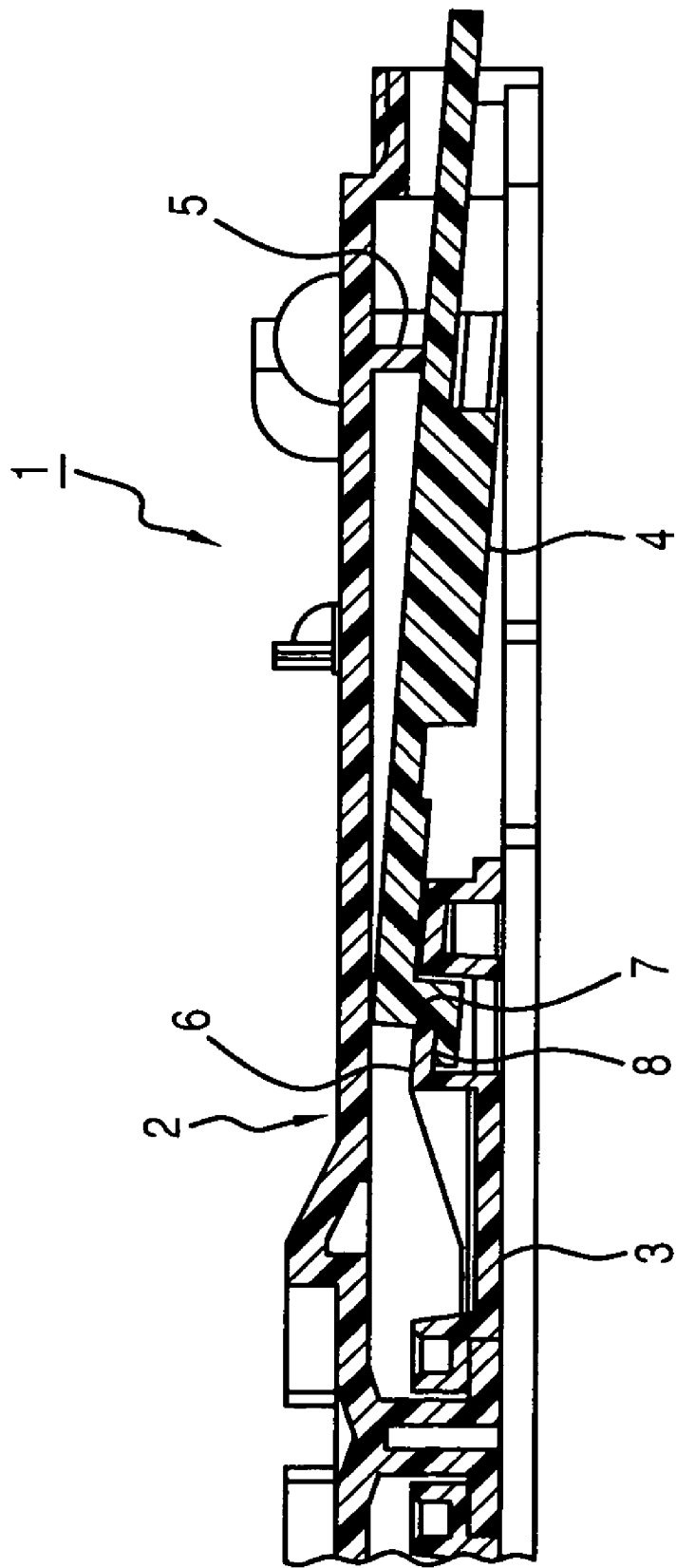
FIG. 2 is a sectional side elevation of a conventional lid unit for a thin plate supporting container.

Embodiments of the invention will be described hereinbelow with reference to the appended drawings. The thin plate supporting container of the invention is a container for housing thin plates such as semiconductor wafers, storage disks, and liquid crystal glass substrates and is used for storage, transport, manufacturing line, and the like. A thin plate supporting container for housing semiconductor wafers will be described here as an example. Different lid units closing the thin plate supporting container are used for, respectively, transport and in a manufacturing line.

First Embodiment

A thin plate supporting container 11 according to a first embodiment has, as shown in FIGS. 3 to 8, a container body 12 for housing therein a plurality of semiconductor wafers (not shown), two thin plate support units 13 provided on opposite side walls in the container body 12 for supporting housed semiconductor wafers from both sides, a lid unit 14 for transport and a lid unit 15 for a manufacturing line, each serving to close the container body 12, a top flange 16 held by an arm of a transport apparatus (not shown) in a factory, and a handle 17 to be grasped by a worker when carrying the thin plate supporting container 11.

Figure 3:
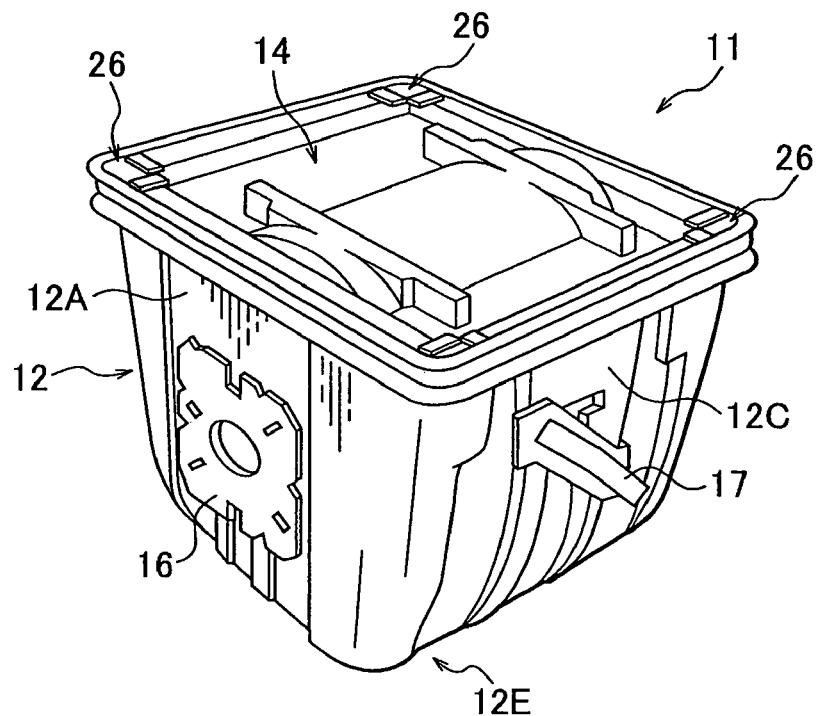
FIG. 3 is a perspective view of the exterior of the thin plate supporting container according to the first embodiment of the invention.
Figure 4:
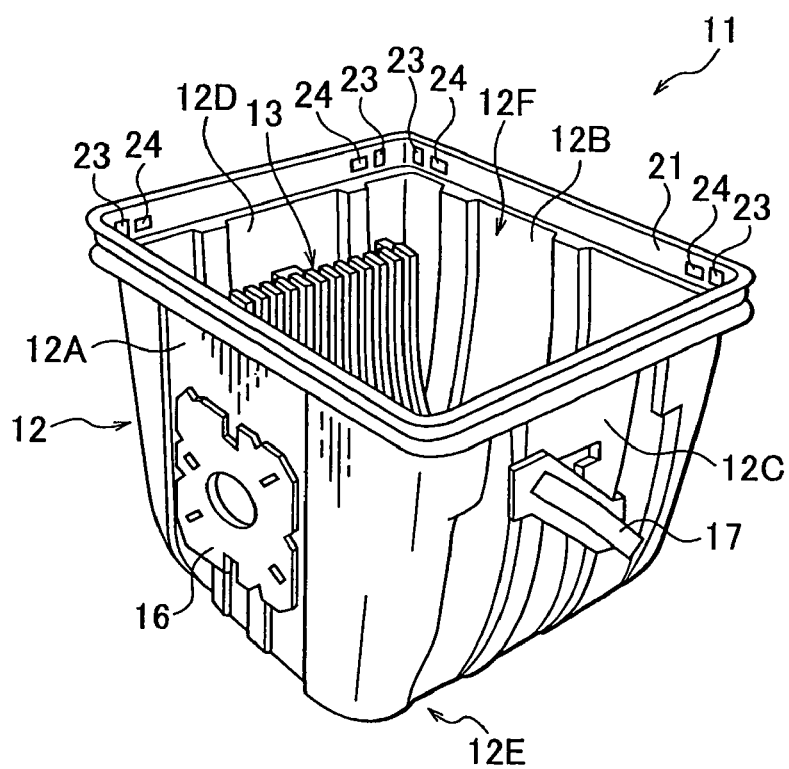
FIG. 4 is a perspective view of the thin plate supporting container according to the first embodiment of the invention with the lid unit removed.

The container body 12 is formed in an almost cubic shape as shown in FIGS. 3 and 4. The container body 12 has four side walls 12A, 12B, 12C, and 12D and a bottom plate 12E in a "portrait orientation", and an opening 12F at the top of the container body 12. When the container body 12 is installed so as to face a robot (not shown) for carrying wafers in an assembly line for manufacture of semiconductor wafers or the like, it is set in "landscape orientation." On the outside of the side wall 12A, which serves as the bottom when the supporting container 11 is set in the landscape orientation, is provided means (not shown) for positioning the thin plate supporting container 11. The top flange 16 is detachably mounted on the exterior of the side wall 12A, serving as the top when the supporting container 11 is set in the landscape orientation. On the exteriors of the side walls 12C and 12D are detachable handles 17 for carrying.

Figure 5:
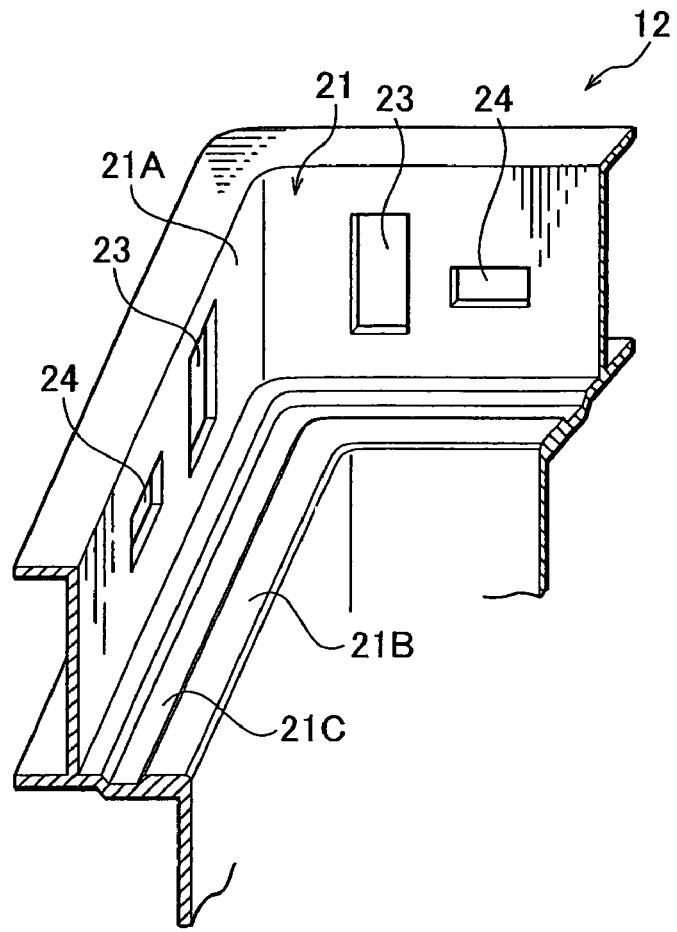
FIG. 5 is a partial perspective view showing a lid unit receiving portion of the thin plate supporting container body according to the first embodiment of the invention.
Figure 6:
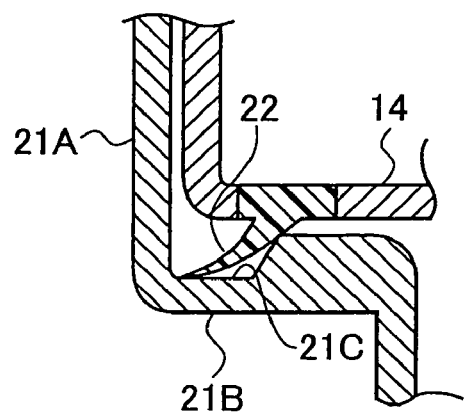
FIG. 6 is a partial cross-section of the lid unit receiving portion of the thin plate supporting container body according to the first embodiment of the invention.

The upper ends of the side walls 12A, 12B, 12C, and 12D of the container body 12 define the opening 12F and form a lid unit receiving portion 21 with vertical plate portions 21A to which the lid unit 14 is fit as shown in FIGS. 5 and 6. The lid unit receiving portion 21 is formed by expanding the upper end of the container body 12 to the dimension of the lid unit 4. Consequently, the lid unit 4 is attached to the lid unit receiving portion 21 by seating within a vertical plate portion 21A of the lid unit receiving portion 21 and coming into contact with a horizontal plate portion 21B. A groove 21C is provided around the circumference of the horizontal plate portion 21B, and a gasket 22 is fit in the groove 21C, thereby keeping air tightness in the thin plate supporting container 11. The inner faces of the vertical plate portions 21A, at the four corners of the lid unit receiving portion 21, have recesses (or openings) 23 which receive lid unit locking pawls (not shown) of a simple latching mechanism 26 (to be described later), to fix the lid unit 14 for transport to the container body 12. The first recesses 23 are square in shape.

Further, near each of the first recesses 23, is located a second recess 24. The second recesses 24 are used to receive a lid used in a manufacturing line. The second recesses 24 each receive a locking member 42 of a simple latching mechanism 32 of the lid unit 15 for use in a manufacturing line, thereby fixing the lid unit 15 to the container body 12.

The lid unit 14 for transport is a conventional lid unit. The lid unit 14 for transport is formed in a saucer shape and its center portion is formed in a saucer shape with a central outward bulge of a cylindrical shape so avoid contact with the upper edges of semiconductor wafers housed therein.

At each of the four corners of the lid unit 14 for transport, as shown in FIGS. 3 and 4, is a simple latching mechanism 26 for detachably fixing the lid unit 14 for transport to the container body 12. The simple latching mechanism 26 for transport includes lid unit locking pawls (not shown) which project from the periphery of the lid unit 14. The lid unit locking pawls are received in the first recesses 23.

Figure 7:
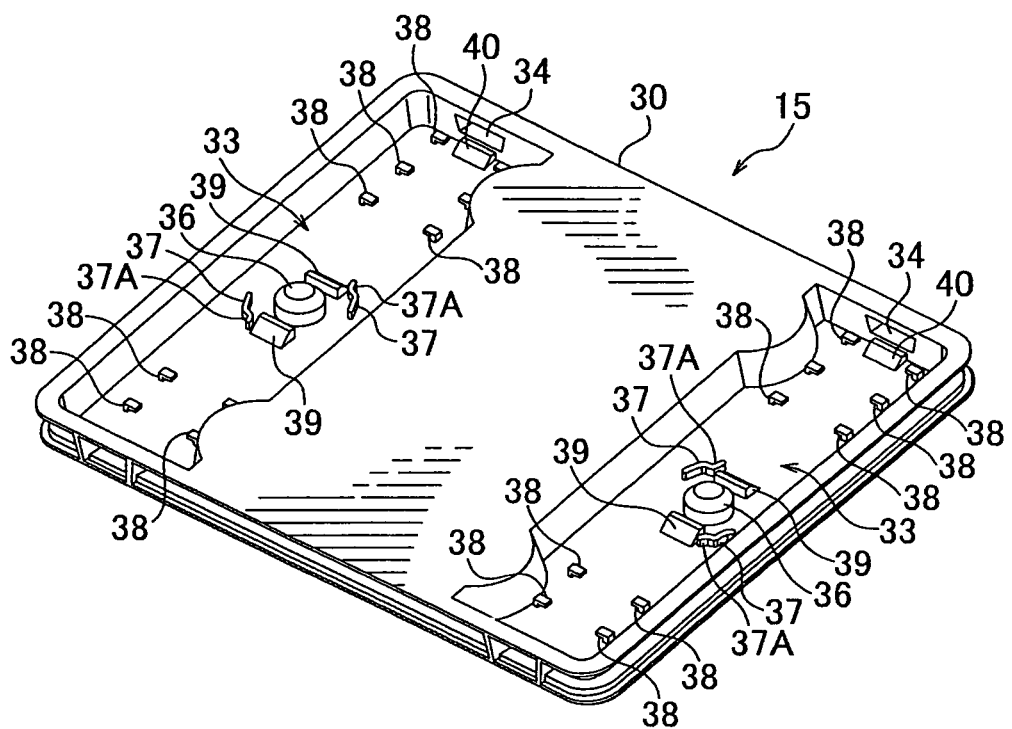
FIG. 7 is a perspective view showing the top face of the lid unit of the first embodiment of the invention.
Figure 8:
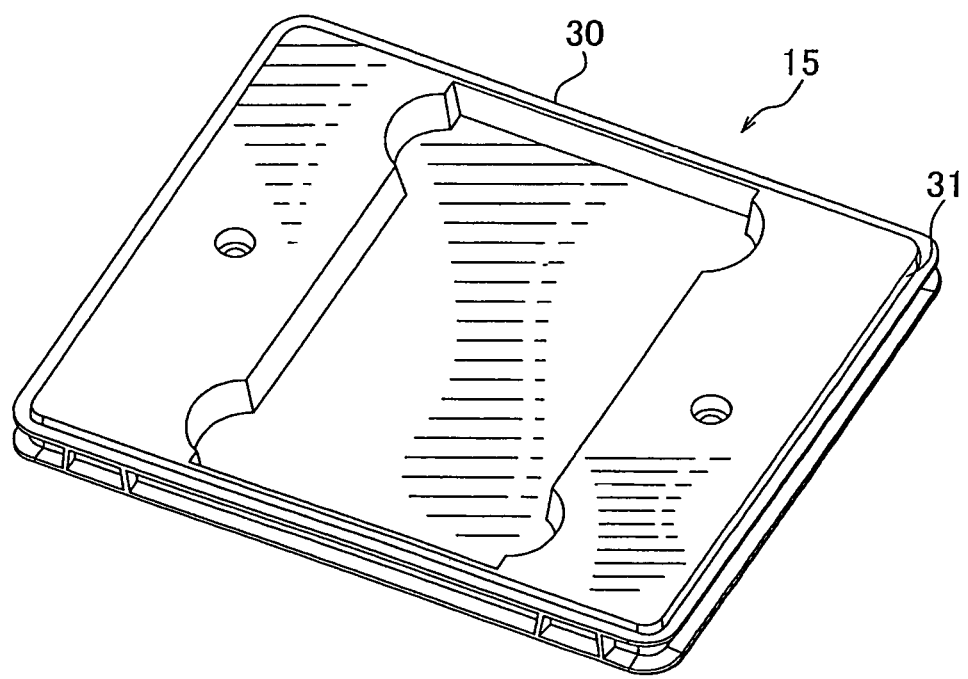
FIG. 8 is a perspective view showing the bottom of the lid unit of the first embodiment of the invention.
Figure 9:
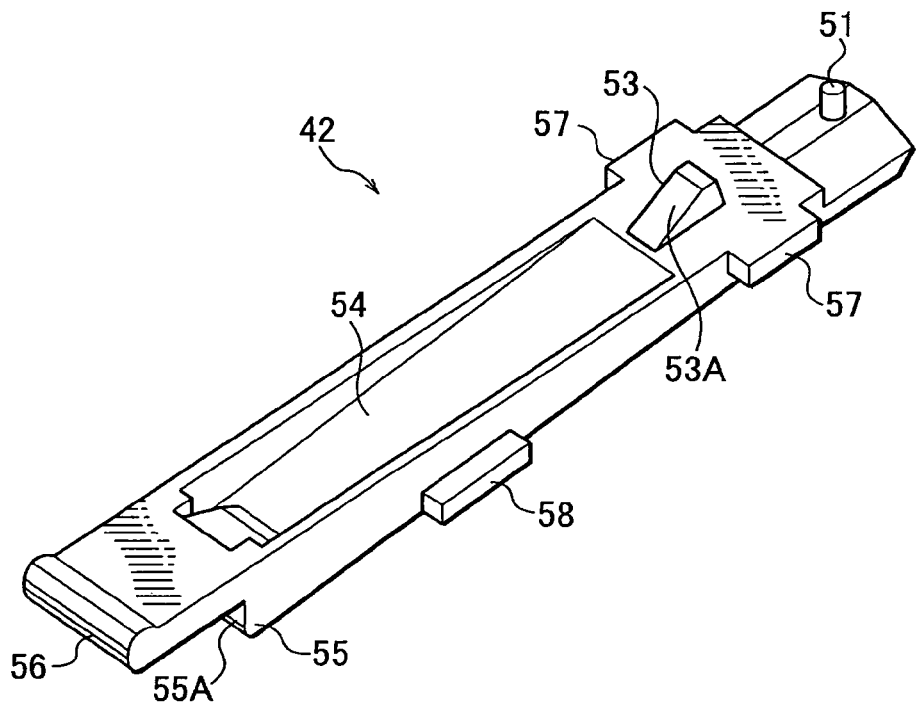
FIG. 9 is a perspective view showing the top face of a locking member according to the first embodiment of the invention.
Figure 10:
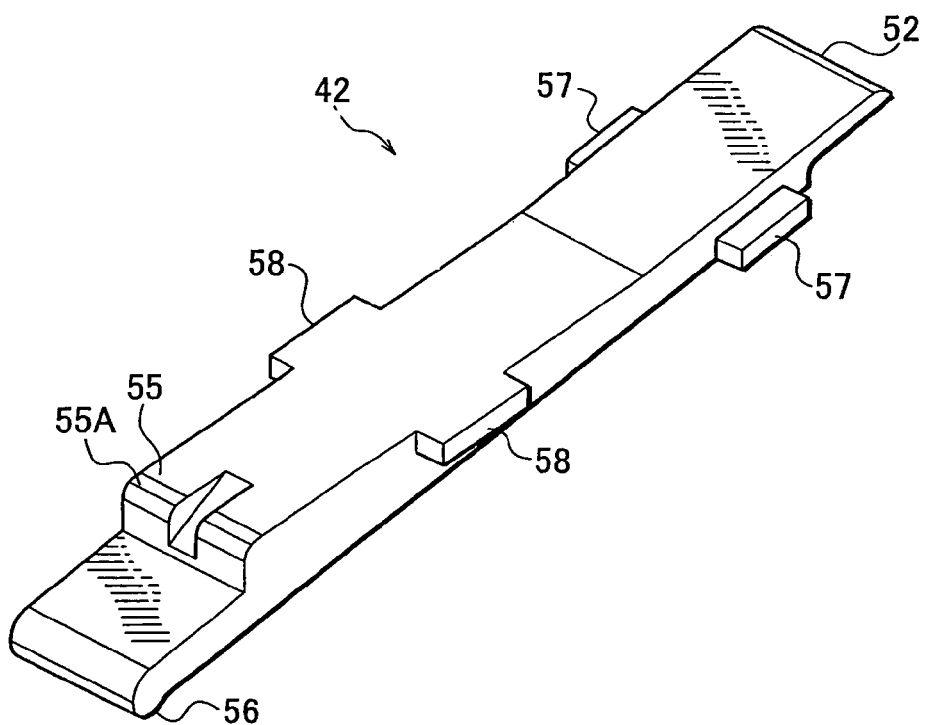
FIG. 10 is a perspective view showing the bottom of the locking member according to the first embodiment of the invention.
Figure 11:
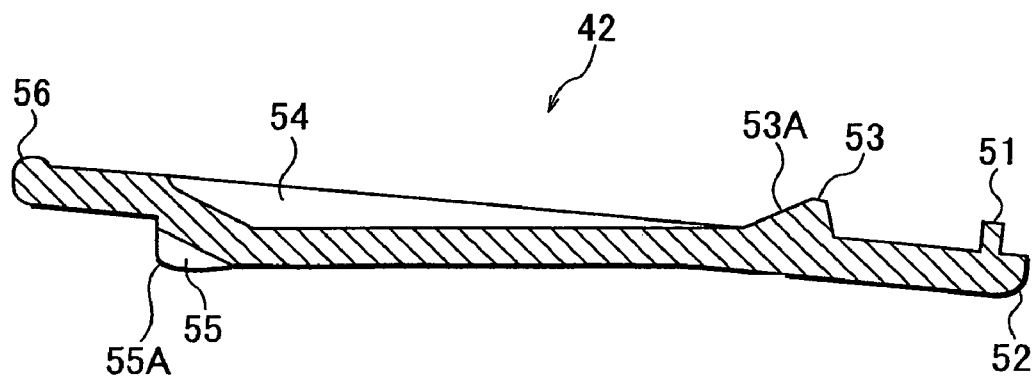
FIG. 11 is a sectional side view showing the locking member according to the first embodiment of the invention.
Figure 12:
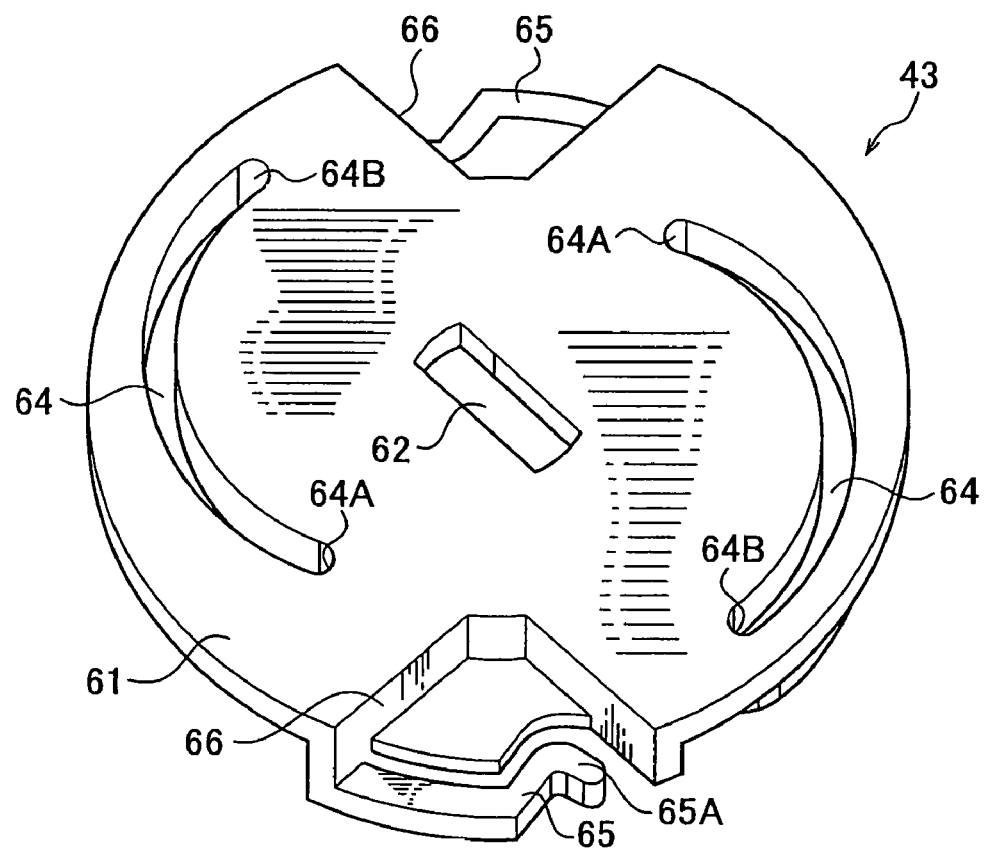
FIG. 12 is a perspective view of the top face of a locking mechanism according to the first embodiment of the invention.
Figure 13:
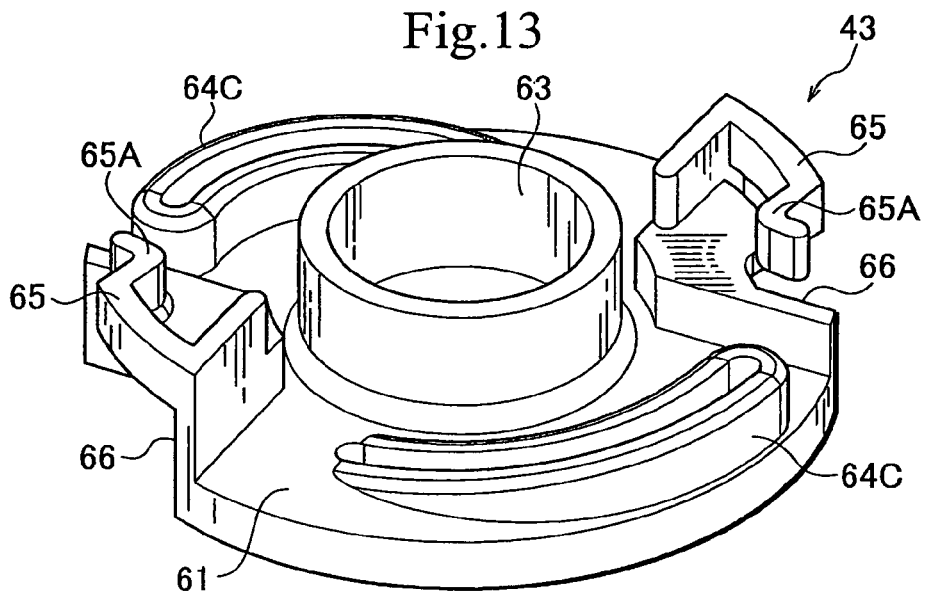
FIG. 13 is a perspective view showing the bottom of the locking mechanism according to the first embodiment of the invention.
Figure 14:
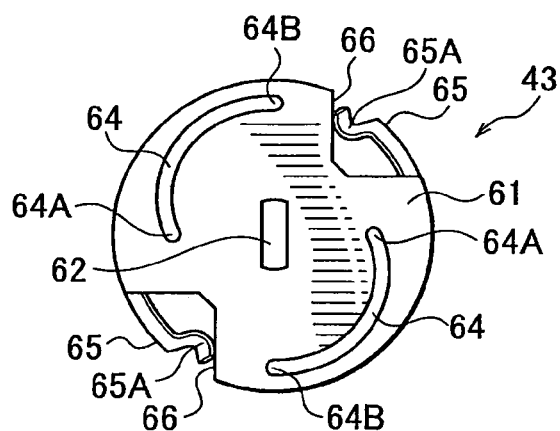
FIG. 14 is a plan view of the locking mechanism of the first embodiment of the invention.
Figure 15:
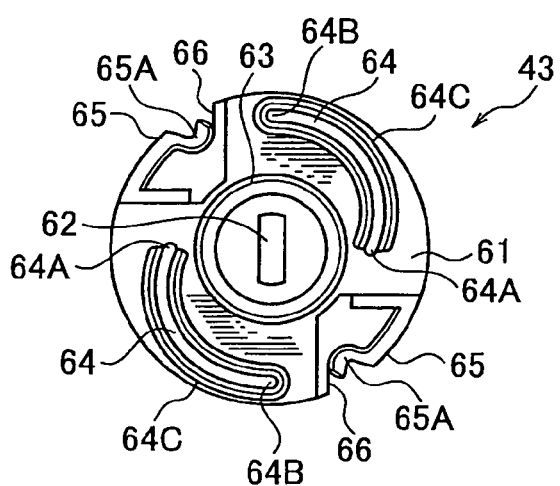
FIG. 15 is a bottom view of the locking mechanism of the first embodiment of the invention.

The lid unit 15 for the manufacturing line is a lid which enables the container body 12 of the container 11 to be used as is in a factory manufacturing line. The lid unit 15 for the manufacturing line includes, as shown in FIGS. 7 and 8, a lid body 30, a cover plate (not shown), and the simple latching mechanism 32 (see FIG. 1).

The lid body 30 is formed in an almost square shape and is sufficiently thin so as not to protrude when attached to the lid unit receiving portion 21 of the container body 12. Around the lower portion of the lid body 30 is a gasket receiving portion 31. A gasket (not shown) is mounted on the gasket receiving portion 31. In a state where the lid body 30 is attached to the lid unit receiving portion 21, the gasket receiving portion 31 is fit in the seal groove 21C to seal the container body 12. The gasket is properly formed in accordance with the shape of the seal groove 21C in a manner similar to the gasket 22 of the transport lid unit 14.

At each of opposing sides (both lower right and upper left sides in FIG. 7) of the lid body 30 is a recess 33 with a latching mechanism 32 mounted therein. The recesses 33 are formed as indentations of almost rectangular shape in end portions of the lid 30. In each of opposing walls defining the recesses 33 (both ends on the upper right and lower left sides in FIG. 7.), are openings 34 which receive a tip portion 56 of the locking member 42 (described later). The opening 34 is provided in a position corresponding to the position of the second fitting portion 24 in the lid unit receiving portion 21 in a state where the body 30 is fit in the lid unit receiving portion 21. Fixed to the bottom of each of the recesses 33, is a support shaft 36, stoppers 37, locking pawls 38, base-end lower cams 39, and tip-side cams 40. A cover plate detachably covers each recess 33. The cover plates can be removed for cleaning the simple latching mechanism 32.

Each support shaft 36 rotatably supports an actuator 43. The support shaft 36 is fit into a cylindrical hole 63 in the actuator 43. The stoppers 37 engage the actuator 43 when the actuator 43 is turned to a predetermined angle. The stoppers 37 are formed as plate-shaped members which rise from the bottom of recess 33 at two positions around the support shaft 36 and which are curved to form receiving portions 37A. By fitting a projection 65A of a engaging piece 65 of the actuator 43 within the receiving portion 37A, the actuator 43 is supported at a predetermined angle.

The locking pawl 38 is a member for fixing a cover presser 46 to the bottom of the recess 33. The cover pressers 46 are provided on opposing sides in the recess 33, so that six locking pawls 38 are attached at each of opposing sides in each recess 33. The locking pawl 38 has an L shape. A lower supporting plate piece 88 of the cover presser 46 is fitted within and held by the opposing locking pawls 38.

The base-end lower cam 39 and the tip-side cam 40 together constitute a cam mechanism 44 to be described later. The base-end lower cam 39 and a base-end upper cam 53 together form a base-end-side cam for extending the locking member 42.

The base lower-side cam 39, as shown in FIGS. 1 and 7, allows the base-end of the locking member 42 to be pressed (downward in FIG. 1) to project the locking member 42. The base-end lower cams 39 are provided on both sides of the support shaft 36 and are formed with an almost triangular shaped cross-section providing an oblique surface 39A on which the base-end side of the locking member 42 slides. The oblique surface 39A is mirror-finished to reduced frictional resistance with a sliding surface 52 of the locking member 42.

The tip-side cam 40 allows the tip portion 56 of the locking member 42 to be lifted upward (in FIG. 1) in association with projection of the locking member 42. A tip-side cam 40 is provided at each end of the longest dimension of the recess 33, facing an opening 34. The tip-side cam 40 has a triangle shape in cross-section and oblique surface 40A for lifting the tip of the locking member 42 upward. The oblique surface 40A is mirror-finished so as to reduce frictional resistance with a tip-side sliding face 55A of a fulcrum portion 55 of the locking member 42. At the upper end of the oblique surface 40A is a recess 40B in which the fulcrum portion 55 of the locking member 42 is fitted.

The recess 33 houses the latching mechanism 32 which enables the lid unit 15 for the manufacturing line to be easily attached/detached to/from the container body 12. The latching mechanism 32 includes, as shown in FIG. 1, the locking member 42, the actuator 43, the cam mechanism 44, a holding cover 45, and the cover presser 46.

The locking member 42 when projected from the opening 34 in the lid body 30 is received in the second recess 24 in the lid receiving portion 21 to attach the lid unit 15 for the manufacturing line to the container body 12. The locking member 42 as shown in FIG. 1 and FIGS. 9 to 11, includes a coupling shaft 51, the base-end-side sliding surface 52, the base-end upper cam 53, an upper groove 54, the fulcrum portion 55, the tip portion 56, a base-end side plate 57, and tip side plates 58.

The coupling shaft 51 is fit into an arcuate camming groove 64 in the actuator 43, thereby coupling the actuator 43 and the locking member 42 to each other. The coupling shaft 51 is formed in the shape of a round bar and is located at the base end portion of the locking member 42.

The base-end-side sliding surface 52 is a portion which comes into slidable contact with the oblique surface 39A of the base-end lower cam 39 to vertically move the base end portion of the locking member 42. The base-end-side sliding surface 52 is formed as an oblique cut traversing the base end of the locking member 42. The base-end-side sliding surface 52 is mirror-finished to reduce frictional resistance with the oblique surface 39A of the base-end lower cam 39. When the locking member 42 is projected outward to its engaged position (engaged within a second recess 24) with the base-end-side sliding surface 52 in slidable contact with the oblique surface 39A of the base-end lower cam 39, the base-end portion of the locking member 42 is pushed downward. When the locking member 42 is retracted to its disengaged position, the base-end portion of the locking member 42 is pushed upward.

The base-end upper cam 53 serves as the power point in a lever action to vertically move the base-end portion of the locking member 42 in cooperation with the base-end lower cam 39. The coupling shaft 51 does not serve as a power point, but simply serves as a reaction member, receiving force when the locking member 42 is projected/retracted.

The base-end upper cam 53 is located near the base end portion of the locking member 42, is formed with a triangular shape in cross-section and has an oblique surface 53A which serves to move the locking member 42 vertically. The oblique surface 53A of the base-end upper cam 53 is mirror-finished in a manner similar to the oblique surface 39A of the base-end lower cam 39 and is in slidable contact with a projection 69 on the holding cover 45. The oblique surface 53A of the base-end upper cam 53 is almost parallel with the oblique surface 39A of the base-end lower cam 39. With this configuration, when the locking member 42 is projected with the projection 69 pressed against and in slidable contact with the oblique surface 53A of the base-end upper cam 53, the base-end portion of the locking member 42 is pushed downward. When the locking member 42 is retracted with the base-end sliding surface 52 pressed against the oblique surface 39A of the base-end lower cam 39, the base-end portion of the locking member 42 is pushed upward.

The fulcrum portion 55 supports the tip portion of the locking member 42 and serves as the center of rotation, i.e. as a fulcrum in the action of a lever. The fulcrum portion 55 extends at an almost right angle from the bottom face of the tip portion of the locking member 42. The tip sliding surface 55A is formed at the vertex of the fulcrum portion 55. The tip sliding surface 55A slidably contacts the oblique surface 40A of the tip-side cam 40 to vertically move the tip fitting portion 56 of the locking member 42. The tip sliding surface 55A is formed as an oblique cut in the vertex of the fulcrum portion 55. The tip sliding surface 55A is mirror-finished so as to reduce frictional resistance with the oblique surface 40A of the tip-side cam 40. When the locking member 42 is projected with the tip sliding surface 55A in slidable contact with the oblique surface 40A of the tip-side cam 40, the tip portion 56 of the locking member 42 is pushed upward. Conversely, when the locking member 42 is retracted, the tip portion 56 is pushed downward.

Further, the fulcrum portion 55 is fit within the recess 40B of the tip-side cam 40 (see FIG. 1) and swings around the recess 40B as a center.

The tip portion 56, when extended through the opening 34 in the lid unit 15, becomes seated within a second recess 24 in portion 21 of the container 11. The tip portion 56 serves as the point of application of force in the action of a lever. The tip fitting portion 56 is spaced a small distance from the fulcrum portion 55 so as to exert sufficient force within the second recess 24 to secure the lid unit 15 to the lid receiving portion 21.

The base-end side plates 57 and the tip side plates 58 support and guide the reciprocating movement of the locking member 42.

The actuator 43 operates to project/retract the locking member 42 and is rotatably mounted on the shaft 36 within the recess 33. The actuator 43 includes, as shown in FIGS. 1, 7, 12, 13, 14, and 15, a top plate 61, a key groove 62, cylindrical portion 63 (FIG. 13), arcuate camming grooves 64, and engagement pieces 65.

The top plate 61 is formed in an almost disc shape. In two opposing positions in the top plate 61, notches 66 are cut to form the engagement pieces 65.

The key groove 62 is located in the center of top plate 61 and receives a lid unit attaching/detaching apparatus (not shown) for automatically attaching/detaching the lid unit 15 in use on a manufacturing line.

The cylindrical portion 63 is fitted on shaft 36 for rotatably supporting the actuator 43. The cylindrical portion 63 extends from the center of the bottom surface of the top plate 61. The key groove 62 is centrally located relative to cylindrical portion 63.

The arcuate camming grooves 64 convert the rotation of the actuator 43 into the linear projecting/retracting motion of the locking member 42. An arcuate camming groove 64 is formed in each of two opposing positions in the top plate 61 and each is formed as a spiral so that its one end 64A is close to the center of the top plate 61 and the other end 64B is further from the center. When the coupling shaft 51 of the locking member 42 is located at one end 64A of the arcuate camming groove 64, the locking member 42 is retracted. When the coupling shaft 51 is located at the other end 64B, the locking member 42 is projected (engaged position).

At the bottom surface of the top plate 61 the arcuate camming groove (or "slot") is provided with a gently sloped wall surface 64C. The wall surface 64C slopes from the bottom of the top plate 61 at one end 64A of the arcuate camming groove 64 away form top plate 61 toward the other end 64B in order to reliably engage the locking member 42 with the actuator 43. Thus, when the coupling shaft 51 is located at end 64B of the arcuate camming groove 64, the base-end portion of the locking member 42 is pushed downward (toward the container body 12). Even with the base-end portion pushed down, the coupling shaft 51 is reliably retained within the arcuate camming groove 64.

The engagement pieces 65 support the actuator 43 in rotation through a predetermined angle. The engagement pieces 65 are provided in opposing positions on the periphery of the top plate 61. The engagement piece 65 is a plate member extending from the periphery of the top plate 61. At the tip of the engagement piece 65 is a bent portion 65A which mates with the receiving portion 37A of the stopper 37. The engagement piece 65 is elastic and elastically supports the projection 65A. By engagement of the bent portion 65A with the receiving portion 37A of the stopper 37, the actuator 43 is held at a predetermined angle at which the locking member 42 is engaged within second recess 24 to fix the manufacturing line lid unit 15 to the container body 12.

The cam mechanism 44 causes the tip portion 56 of the locking member 42 to come into contact with the top face of the second recess 24 and to thereby press the lid unit 15 downward and to fix the lid unit 15 to the container body 12. In other words, the cam mechanism 44 causes the tip portion 56 of the locking member 42, extended by the operation of the actuator 43, to be pressed down so as to come into contact with the rim around the second recess 24. Simultaneously, the base-end portion is pressed downward, thereby pressing the lid unit 15 downward to fix the lid unit 15 to the container body 12 by a lever action. The cam mechanism 44 includes the base-end lower cam 39, base-end upper cam 53, base-end sliding surface 52, cam pressing projection 69, tip-side cam 40, and tip sliding surface 55A. The base-end lower cam 39, base-end upper cam 53, base-end-side sliding surface 52, tip-side cam 40, and tip sliding surface 55A are as described above.

The camming projection 69 extends from the bottom surface of the holding cover 45, slides along the oblique surface 53A of the base-end upper cam 53, and presses the base-end portion of the locking member 42 downward (toward the container body 12) in association with projection of the locking member 42. With the base-end-side sliding surface 52 of the locking member 42 in slidable contact with the oblique surface 39A of the base-end lower cam 39, the camming projection 69 is positioned in slidable contact with the oblique surface 53A of the base-end upper cam 53, i.e. without a gap therebetween.

Figure 16:
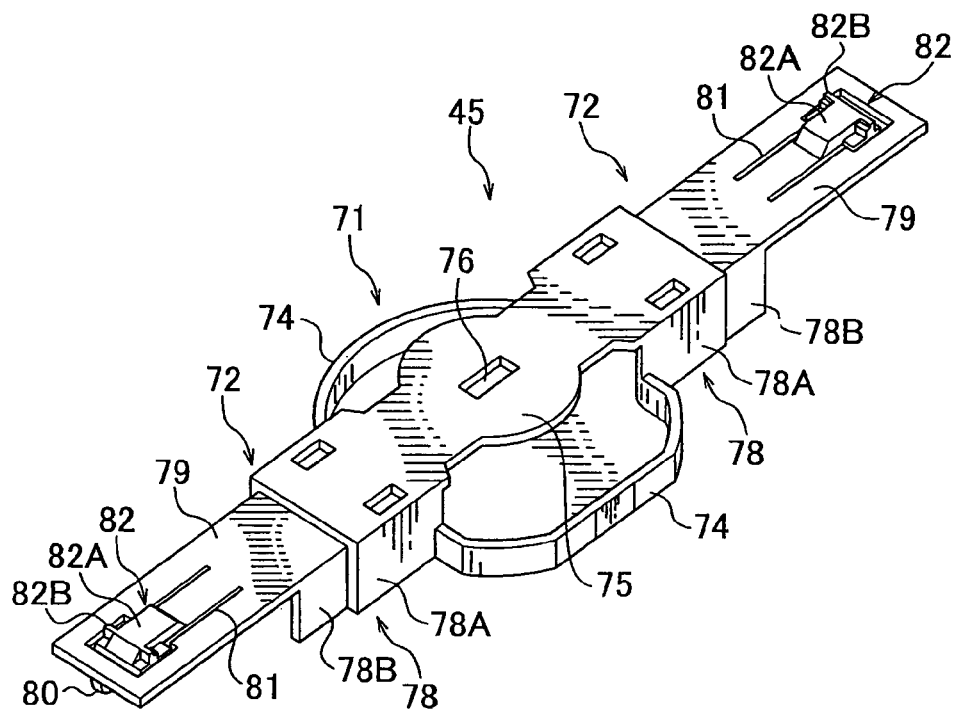
FIG. 16 is a perspective view showing the top face of a cover latching mechanism according to the first embodiment of the invention.

Each holding cover 45 holds a pair of locking members 42 and the actuator 43. The holding cover 45, as shown in FIGS. 16 and 17, includes a central portion 71 housing actuator 43 and arm portions 72, each housing a locking member 42.

The central portion 71, which rotatably supports the actuator 43, is formed of peripheral plates 74 and a top plate 75. In the center of the top plate 75 is a key hole 76 having the same size as the key groove 62 in the actuator 43. When the locking member 42 is retracted (in its disengaged position), the key groove 62 and the key hole 76 are aligned with each other.

The arm portions 72 each support a locking member 42 for linear reciprocating motion. Each of the arm portions 72 is formed of side plates 78 and a top plate 79 which support the base-end portion of the locking member 42. Each side plate 78 has a wide portion 78A and an arrow portion 78B. The wide portion 78A receives the base-end side plates 57 of the locking member 42 and the narrow portion 78B fits between the base-end side plates 57 and the tip-side plates 58 of the locking member 42.

Figure 17:
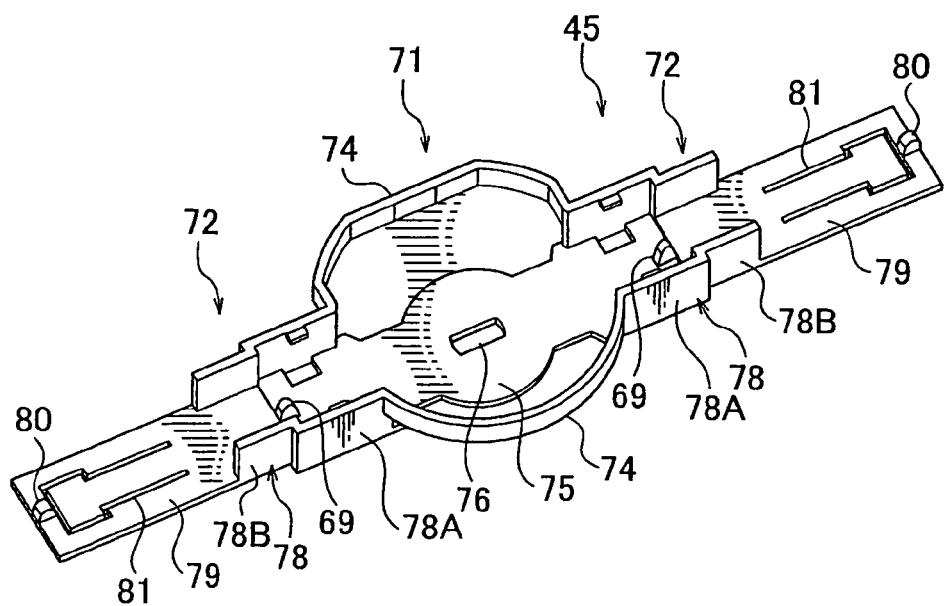
FIG. 17 is a perspective view showing the bottom face of the cover latching mechanism according to the first embodiment of the invention.

As best seen in FIG. 17, at opposing ends of the bottom face of the top plate 79 are projections 80 which are fit into the upper grooves 54 in the locking member 42 and slits 81 forming an elastic arm which carries a projection 82 at its distal end. As seen in FIG. 16, each projection 82 has a center projecting piece 82A and right and left retaining pieces 82B. The center projecting piece 82A and the right and left retaining pieces 82B of the projection 82 are fit into a cross-shaped notch 86A of the cover presser (see FIG. 18) to properly position the holding cover 45 and the cover presser 46.

Figure 18:
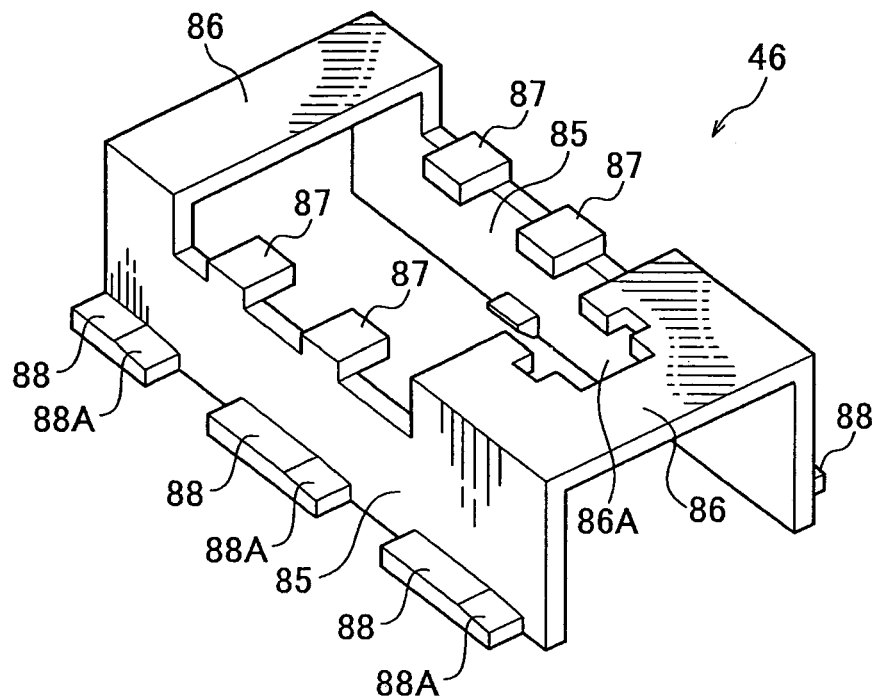
FIG. 18 is a perspective view showing the top face of a cover presser according to the first embodiment of the invention.
Figure 19:
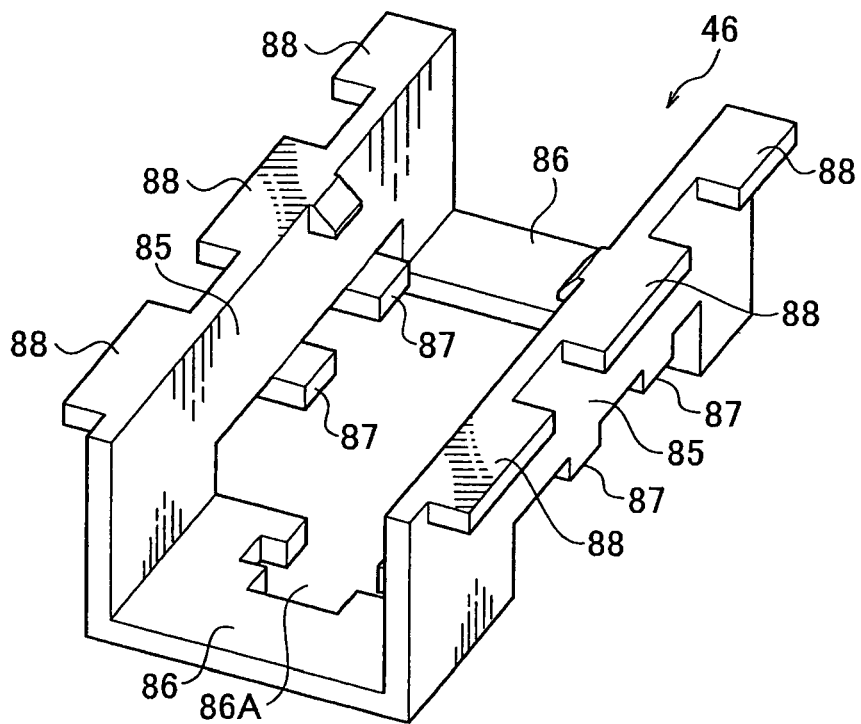
FIG. 19 is a perspective view showing the top face of the cover presser according to the first embodiment of the invention.

As shown in FIGS. 1, 18, and 19, the cover pressers 46 serve to fix the holding cover 45 within the recess 33 in the lid unit 15. Specifically a cover presser 46 supports each of the arm portions 72 to fix the holding cover 45 within the recess 33. Each cover presser 46 has side plates 85, a top plate 86, upper support plates 87, and lower support plates 88.

The side plates 85 on the right and left sides of the locking member 42 guide the reciprocating motion of the locking member 42. The top plate 86 integrally supports the side plates 85 and covers the top of the locking member 42. The upper support plates 87 support the top plate 79 of an arm portion 72 of the holding cover 45 from below. The top plate 79 of an arm portion 72 is supported between the top plate 86 and upper support plates 87 of the cover presser 46. Three lower supporting plate pieces 88 extend from the ends of each of the side plates 85. The lower support plates 88 fit under the locking pawls 38 within the recess 33, thereby fixing the cover pressers 46 within the recess 3. Each of the lower supporting plate pieces 88 has a taper 88A for ease of assembly with the locking pawl 38.

Figure 20:
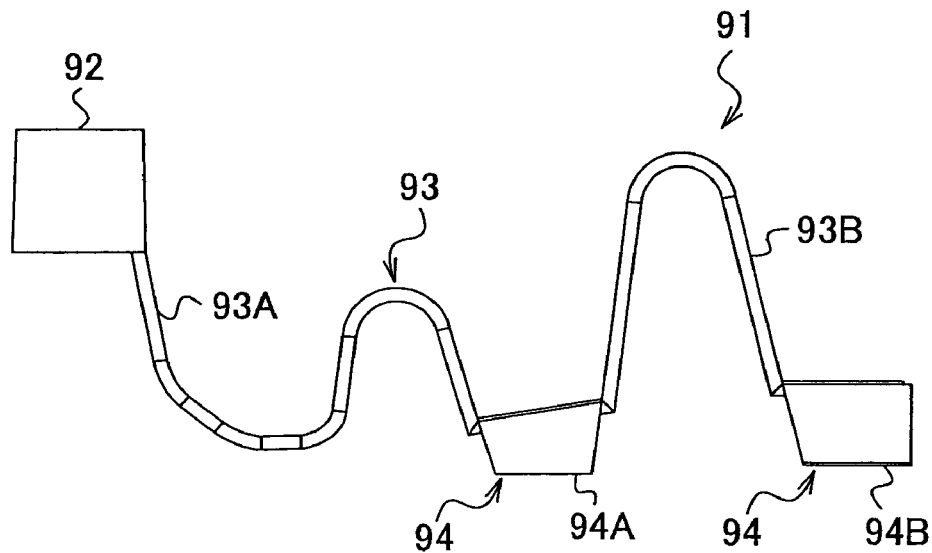
FIG. 20 is a side view showing a wafer holder according to the first embodiment of the invention.
Figure 21:
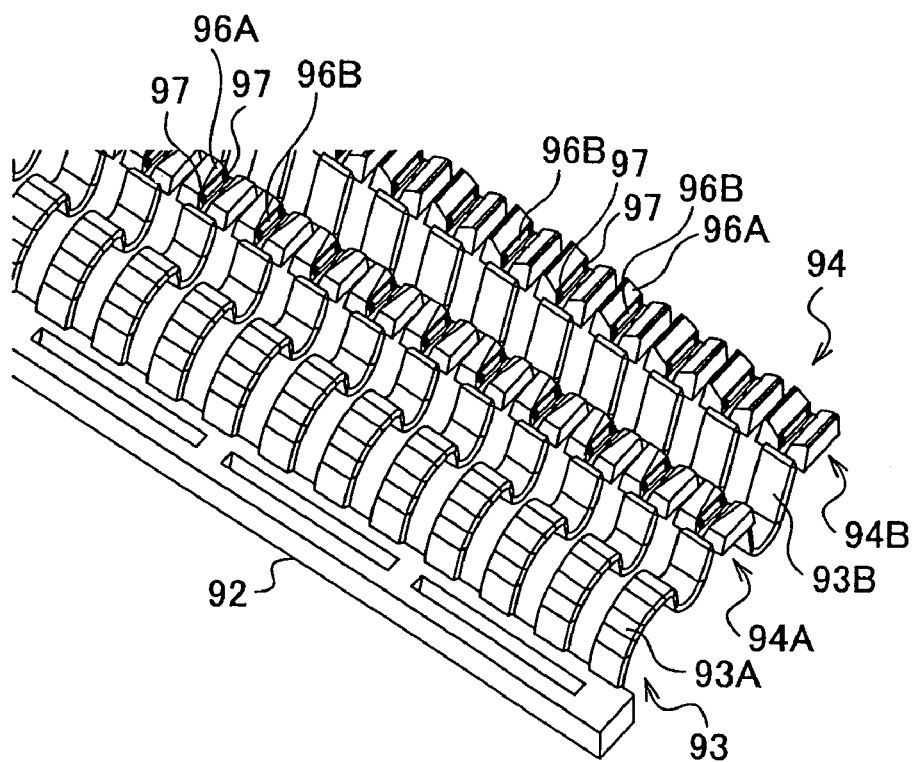
FIG. 21 is a partial perspective view of the wafer holder according to the first embodiment of the invention.
Figure 22:
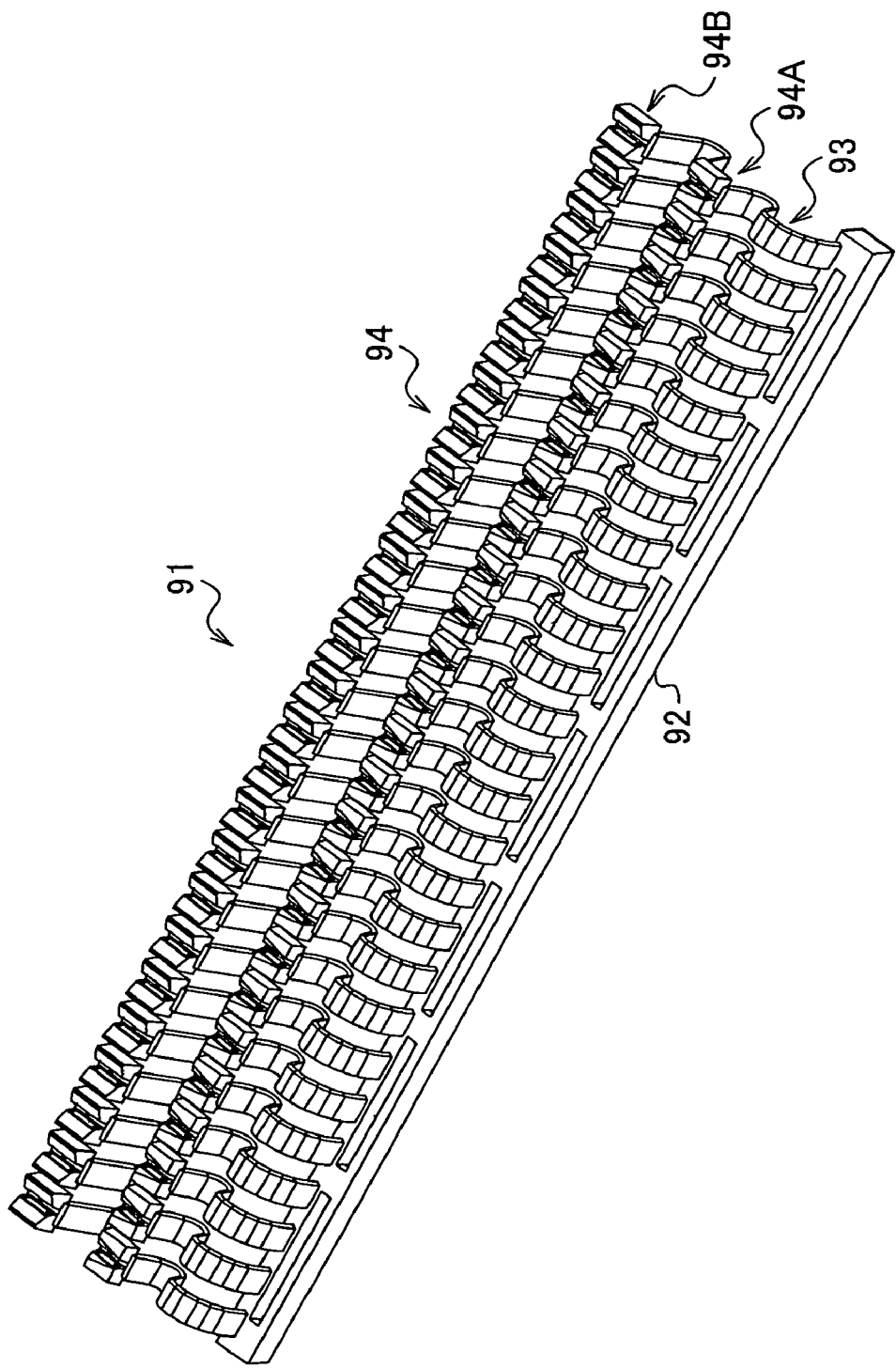
FIG. 22 is a perspective view of the wafer holder according to the first embodiment of the invention.

As shown in FIGS. 20 to 22, mounted on the inner face of each of the transport lid unit 14 and the manufacturing line lid unit 15 is a wafer presser 91. The wafer presser 91 serves to support the semiconductor wafers from above within the container body 12. The wafer presser 91 has end supports 92, an elastic plate supporting section 93 and plate contact brackets 94.

The end supports 92 serve to support the elastic support plates 93 and the plate contact brackets 94. The base-end support portion 92 is formed in the shape of a square bar extending the full length of the wafer presser 91 and is fixed to the inner face of the lid unit.

The elastic support plates 93 elastically support the contact brackets 94. The elastic supporting plates 93, in a number corresponding to the number of semiconductor wafers housed in the container body 12, are fixed to the end support 92 in a linear array. Each elastic support plate 93 includes a first plate support section 93A bent in an S shape in side view and a second support plate section 93B bent in an U shape. The base-end portion of the first plate support section 93A is fix to the end support 92, and a first contact piece 94A is fixed to the tip of the first support plate section 93A. The base-end portion of the second plate support section 93B is integrally connected to the first plate support section 93A via a first contact piece 94A, and a second contact piece 94B is fixed to the tip of the second support plate piece 93B.

The first and second contact pieces 94A and 94B directly contact and support a semiconductor wafer. Thus, each semiconductor wafer is supported in two positions. The plate contact bracket 94 is formed of pairs of blocks 96 and supporting pawls 97, alternately arranged.

Each of the blocks 96 has an inclined surface 96A or a contact surface 96B. The inclined surfaces 96A of a block pair face each other to form an opening therebetween into which the peripheral portion of a semiconductor wafer is easily inserted. The contact surfaces 96B define a groove therebetween having a predetermined width slightly wider than the thickness of the semiconductor wafer.

The supporting pawls 97 come into direct contact with the peripheral portion of a semiconductor wafer to support the semiconductor wafer. A supporting pawl 97 is provided for the contact surface 96B of each block and takes the form of an elongated projection. Two supporting pawls 97 are provided at both ends of the contact surface 96B and one supporting pawl 97 is provided in the center of the facing contact surface 96B, whereby the facing supporting pawls 97 are arranged in a staggered configuration. Each of the supporting pawls 97 is formed of an elastic material, and elastically supports the peripheral portion of a semiconductor wafer. Since the width between the two contact surfaces 96B is slightly wider than the thickness of the semiconductor wafer, the interval between the tips of the supporting pawls 97, disposed on the contact surfaces 96B, is narrower than the thickness of the semiconductor wafer. Consequently, the semiconductor wafer is inserted between the supporting pawls 97 with a slight push.

Figure 23:
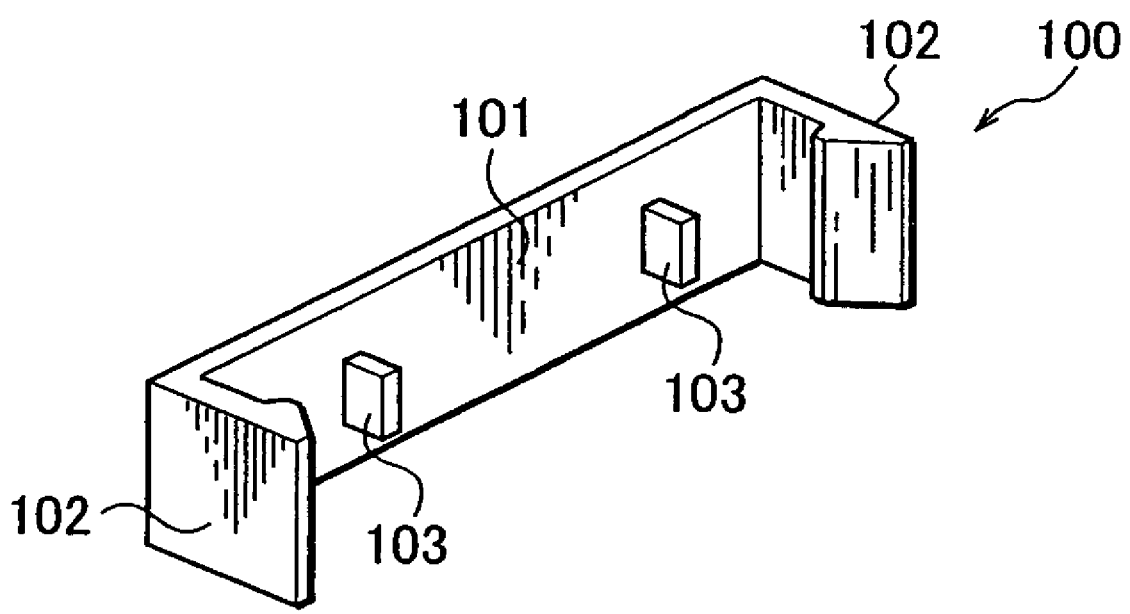
FIG. 23 is a perspective view showing a lid unit holder according to the first embodiment of the invention.

A lid unit holder 100 as shown in FIG. 23, is provided on the outside of the lid unit 15 to prevent the lid unit 15 from coming off the container body 12. The lid unit holder 100 is in the form of a supporting plate 101, hooks 102, and fitting projections 103.

The hooks 102 provided at the distal ends of the supporting plate 101, latch onto the flange of the container body 12.

Each fitting projection 103 is formed in the same shape as key groove 62 and is inserted into the key groove 62 via the key hole 76. Thus, the two fitting projections 103 are provided at positions aligned with the two key grooves 62. Consequently, with the hooks 102 latched on the flange of the container body 12, the fitting projections 103 are lodged within the key grooves 62 to fix the actuator 43. This is to prevent the lid unit 15 from loosening when the feeding member 43 is moved by vibration, shock, or the like during transportation of the thin plate supporting container 11.

The thin plate supporting container 11 constructed as described above is used as follows.

Figure 24A:
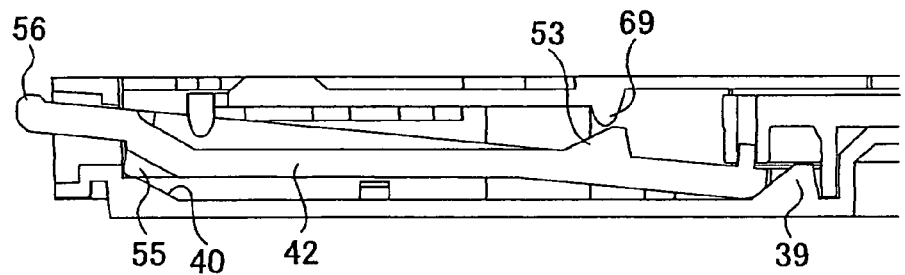
FIGS. 24A to 24D are schematic diagrams showing the operation of a simple latching mechanism according to the first embodiment of the invention.
Figure 24B:
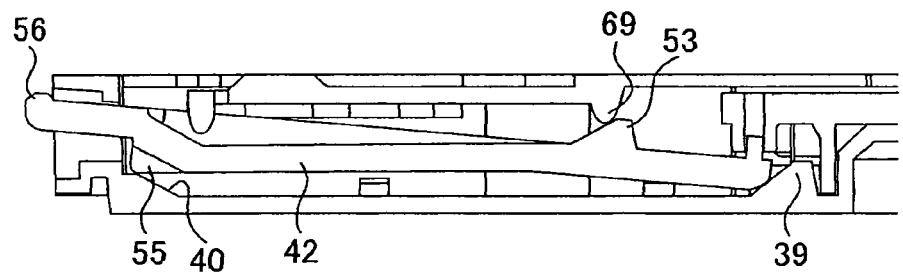
Figure 24C:
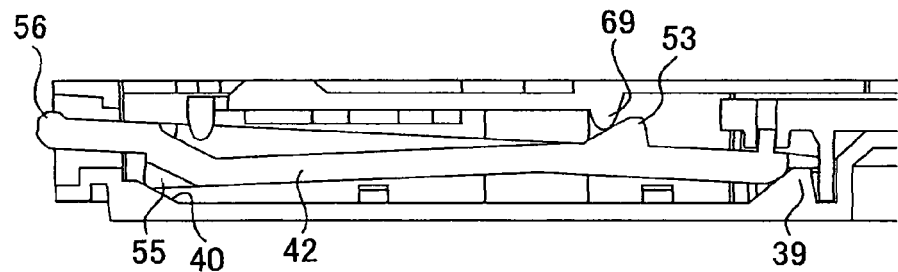
Figure 24D:
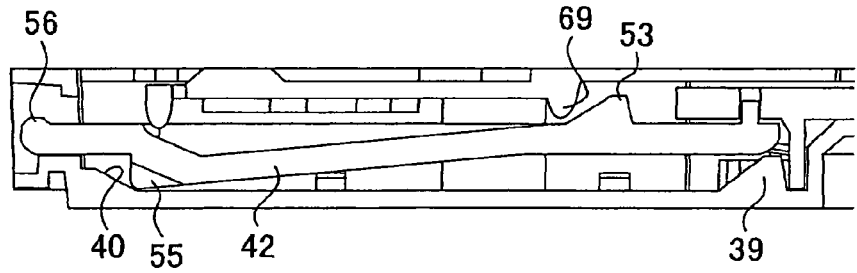

To detach the lid unit 15 from the container body 12, the latch key is inserted in the key groove 62 and turned. By turning the latch key, beginning with the position shown in FIG. 24A, the actuator 43 is turned and the locking members 42 are gradually retracted, with the tip surface 55A of the fulcrum 55 sliding along the oblique surface 40A of the tip-side cam 40. As shown sequentially in FIGS. 24B, 24C, and 24D, the tip portion 56 is gradually pushed downward. Simultaneously, the base-end sliding surface 52 of the locking member 42 slides along the oblique surface 39a of the base-end lower cam 39, and the base-end portion of the locking member 42 is pushed up. The tip portion 56 is thereby completely withdrawn into the body 30. The lid unit 15 may then be lifted from the container body 12.

To attach the lid unit 15 to the container body 12, the lid unit 15 is positioned within the receiving portion 21 and the latch key is inserted in the key groove 62 and turned. By this operation, the reverse of that described, the locking member 42 is extended from the body 30. At this time, the fulcrum 55 of the locking member 42 slides along the oblique surface 40A of the tip-side cam 40 and the tip portion 56 is pushed upward. Further, the camming projection 69 comes into contact with the oblique surface 53A of the base-end upper cam 53 and the base-end portion of the locking member 42 is pressed downward. By this operation, the base-end sliding surface 52 of the locking member 42 is pushed downward along the oblique surface 39A of the base-end lower cam 39.

The tip sliding surface 55A of the fulcrum portion 55 of the locking member 42 is fit in the recess 40B, and the locking member 42 pivots around the fitting recess 40B as a center (see FIG. 1).

At the base-end of the locking member 42, the base-end-side sliding surface 52 slides along the oblique surface 39A of the base-end lower cam 39 and the camming projection 69 comes into contact with the oblique surface 53A of the base-end upper cam 53 to press the base-end portion of the locking member 42 downward.

The locking member 42 operates as a lever with the fulcrum portion 55 fit in the fitting recess 40B, in a state where the tip portion 56 is engaged within the second recess 24 of the lid unit receiving portion 21, strongly pressing the lid unit 15 against the container body 12.

Once the lid unit 15 has been attached to the container body 12, the lid unit holder 100 is then attached. Specifically, the hooks 102 are snapped over the flange of the container body 12, so that the fitting projections 103 are inserted into the key grooves 62 to fix the actuator 43.

As seen in FIGS. 20 and 21 within the container body 12, the peripheries of semiconductor wafers are held by the plate contact bracket 94, i.e. fit between and firmly supported by the supporting pawls 97.

In the case where a strong shock is received by container 11, since the locking member 42 strongly presses the lid unit 15 against the container body 12 by lever action, the lid unit 15 does not separate from the container body 12. Further, since the actuator 43 is fixed by the lid unit holder 100, the locking members 42 do not disengage from the second recesses 24 due to an unintended turning of the actuator 43.

Further, because the semiconductor wafers within the container 11 are secured by the plate contact bracket piece 94 and supported from both sides by the pawls 97, the semiconductor wafers do not become loose. Further, since the plate contact bracket 94 is supported by the elastic support plates 93, wafers are prevented from being damaged.

For cleaning, by sliding the cover pressers 46 so as to detach them from the locking pawls 38, the latching mechanism 32 can be disassembled. By separating the locking member 42, actuator 43, cam mechanism 44, holding cover 45, and cover presser 46 these components can be separately cleaned and dried.

Summarizing the first embodiment offers the following advantages:

(1) Since the locking member 42 is projected by lever action, the manufacturing line lid unit 15 can be securely fixed to the container body 12.

(2) Since the simple latching mechanism can be easily disassembled into its component parts for cleaning, the mechanism can be detached and disassembled into the component parts, and the component parts can be individually cleaned and promptly dried.

(3) Since the supporting pawls 97 are disposed in a staggered manner in contact with the peripheries of the semiconductor wafers, the semiconductor wafers can be supported with reliability.

Second Embodiment

A second embodiment of the invention will now be described. The second embodiment relates to an improvement in the wafer presser.

The thin plate supporting container may be shaken by various events during transportation. When forces are thereby transmitted to the semiconductor wafers, in some cases the semiconductor wafers may undesirably turn. Consequently, when the thin plate supporting container is used in circumstances where it is subject to shaking, a wafer presser according to the second embodiment is used. The wafer presser 121 of the second embodiment will now be described with reference to FIGS. 34 to 43. Since the structure is similar to the container 11 of the first embodiment except for the wafer presser 121, the same reference numerals are used to designate similar members and the description thereof will not be repeated.

Figure 40:
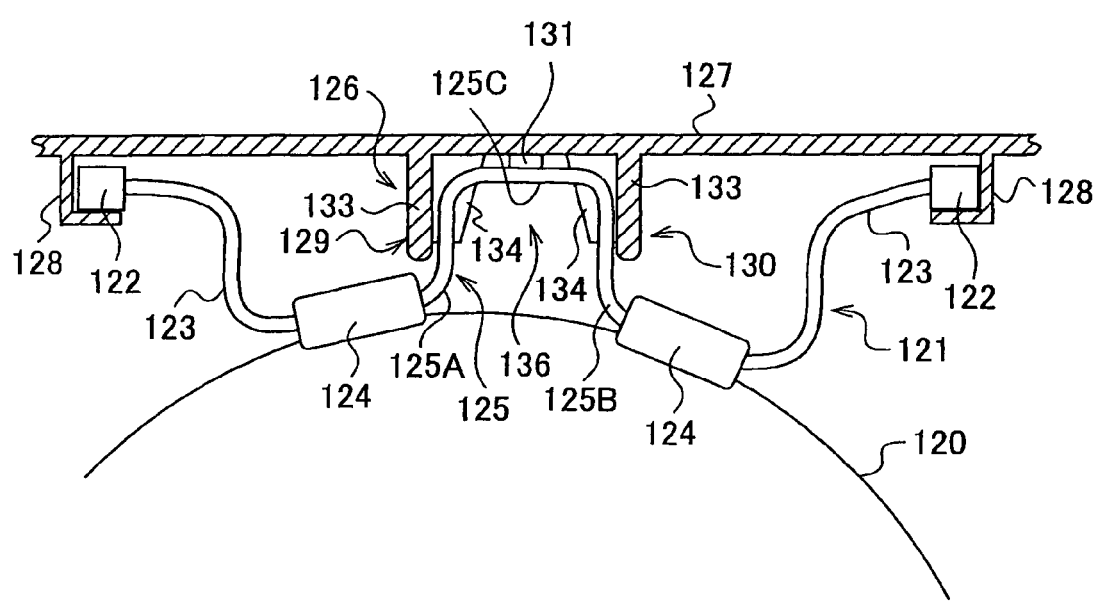
FIG. 40 is an enlarged view of a main portion showing the wafer presser according to the second embodiment of the invention.

The wafer presser 121, as shown in FIG. 40, has end supports 122, elastic support plates 123, contact pieces 124, connecting plates 125, and support ribs 126.

The end supports 122 are provided at both ends of the wafer presser 121, for supporting the elastic supporting plates 123. The end supports 122 are rectangular rods which extend the overall length (vertical direction in FIG. 35) of the wafer presser 121. The inner surface of lid unit 127 carries two hook-shaped brackets 128. The end supports 122 are fit in the respective hook-shaped brackets 128 and thereby fixed to the inner side of the lid unit.

The elastic support plates 123 each elastically support an end of a contact piece 124. Pairs of elastic support plates 123, in a number corresponding to the number of semiconductor wafers 120 housed in the container, are fixed at their base ends to the end supports 122 and are arranged in line. The elastic support plates 123 are bent in an S shape in side view. The contact pieces 124 are attached to the distal ends of the elastic support plates 123 and are thereby elastically supported.

Figure 42:
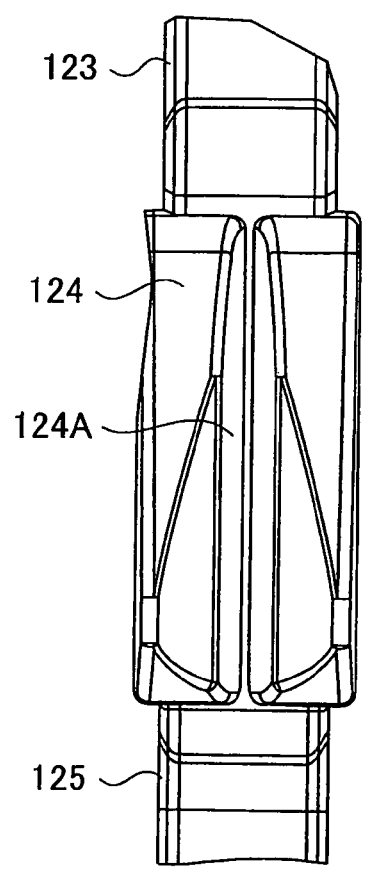
FIG. 42 is an enlarged view of a main portion showing the contact piece of the wafer presser according to the second embodiment of the invention.
Figure 43:
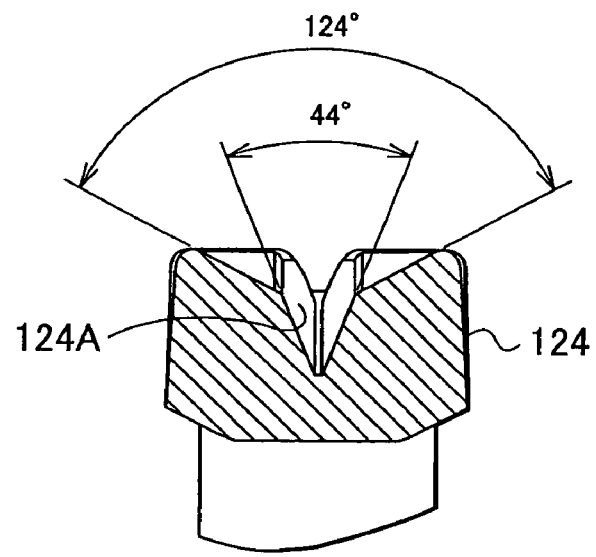
FIG. 43 is a cross section of a main portion of the contact piece of the wafer presser according to the second embodiment of the invention.

The contact piece 124 comes into direct contact with the periphery of a semiconductor wafer 120 to directly support the semiconductor wafer 120. As shown in FIGS. 42 and 43, on one side face of the contact piece 124 is provided a V-shaped groove 124A in which the semiconductor wafer 120 is fitted. The V-shaped fitting groove 124A has two stages. The first stage of the groove 124A has a gentle angle of inclination of 124°. The second stage has an angle of inclination of 44°. When the periphery of the semiconductor wafer 120 comes into contact with the first stage of the groove, the periphery of the semiconductor wafer 120 is guided along the gentle slope and into the second stage. Semiconductor wafer 120 is thereby lodged and supported. The bottom of the groove in the second stage is formed as a flat surface having a width which is almost the same as the thickness of the semiconductor wafer 120. The angle of inclination of the second stage of the groove and the width of the bottom are set according to the dimensions of the periphery of the semiconductor wafer 120. Since the periphery of the semiconductor wafer 120 is cut at an edge angle of 44°, the angle of inclination of the groove is set to 44°. Further, the width of the bottom of the groove is also set in accordance with the width of the periphery of the semiconductor wafer 120. Consequently, when the periphery of the semiconductor wafer 120 becomes lodged in the second stage of the groove, the semiconductor wafer 120 can be supported over a large contact area and thereby prevented from turning when shaken. Although the second stage of the groove is set to have an inclination of 44° in accordance with the angle of the edge of the semiconductor wafer 120, the angle may be a little smaller, depending upon the material of the contact piece 124. Specifically, the angle of the second stage of the groove is properly set within the range from about 40° to 44°, in accordance with variation in elasticity. If the angle of the groove in the second stage is too small, the periphery of the semiconductor wafer 120 may become caught. In such a case, when the lid unit 127 is lifted, the semiconductor wafer 120 may be lifted together with it. Consequently, the angle is set so as not to catch the semiconductor wafer 120. In view of variance in the edge angle of the semiconductor wafer 120, and in the case of a thin plates other than a semiconductor wafer 120, the angle maybe set accordingly within the range of about 20° to 60°.

Figure 41:
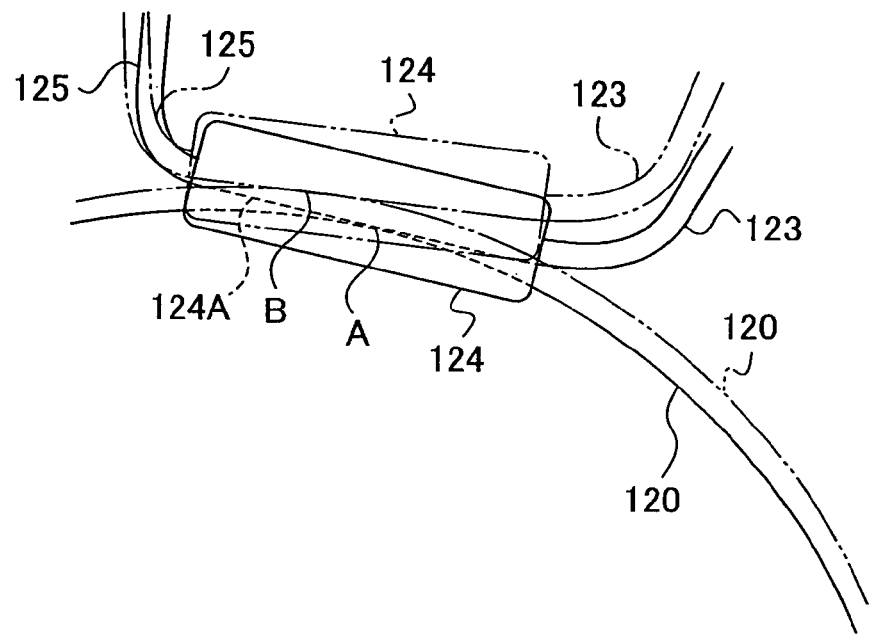
FIG. 41 is a schematic view illustrating movement of a contact piece on the periphery of a thin disc in the second embodiment of the invention.

As shown in FIGS. 40 and 41, the bottom of the fitting groove 124A is set at an angle according to the shape of the periphery of the semiconductor wafer 120, that is, it is set so as to extend in a direction tangential to the periphery of the semiconductor wafer 120. As will be described later, elasticity increases in proportion to the amount of deflection of the wafer presser 121, so that the forces pressing against the semiconductor wafers 120 are equalized by the contact pieces 124. That is, as the amount of force applied by one contact piece 124 increases, the elasticity increases according to the change in the amount of force, whereby the one contact piece 124 slightly moves the semiconductor wafer 120 to the side of the other contact piece 124, and the elastic forces exerted by the two contact pieces 124 equalize. In other words, the elastic forces of the right and left contact pieces are automatically adjusted so as to become the same. Whereby, when the lid unit 127 is attached to the container body 12, the semiconductor wafers 120 come into contact with the bottom at almost the center (contact A in FIG. 41) of the groove 124A.

The connecting plates 125 connect and support the inner ends of the two contact pieces 124. In other words, opposing ends of the connecting plates 125 are respectively connected to the inner ends of the two contact pieces 124 and elastically support the contact pieces 124. The connecting plates 125 are bent into an almost U shape in side view. Specifically, the connecting plates 125 are constructed with vertical plate portions 125A and 125B on opposing sides of a horizontal plate 125C. The vertical plates 125A and 125B are disposed in a direction perpendicular to the inner surface of the lid unit 127 and support the contact pieces 124 without significant deflection.

The horizontal plate 125C is elastically deflected. The function of elastically supporting the contact pieces 124, through the connecting plate 125, is performed mainly by the horizontal plates 125C. The horizontal plate 125C is disposed to extend along the inner surface of the lid unit 127 with vertical plate sections 125A and 125B respectively connected to its opposing ends. The center portion of the horizontal plate 125C is supported by a support bar 131 which will be described later. The opposing ends of the horizontal plate 125C deflect around the supporting projection bar 131 as a center.

The elastic force generated by deformation of the horizontal plate 125 (elastic force supporting one end of the contact pieces 124), is set to be stronger than the elastic force of support plate 123 supporting the opposite end contact piece 124. Therefore, the inner ends of the two contact pieces 124 are supported by the stronger elastic force, and the outer ends are supported by the weaker elastic force. The bottom of the fitting groove 124A of each of the two contact pieces 124 is disposed to be tangential to the periphery of the semiconductor wafers 120 as described above. With the foregoing structure, the force supporting the semiconductor wafers 120 exerted the wafer presser 121 increases in proportion to the amount of movement of the semiconductor wafer 120. In a normal state, as shown by a solid line in FIG. 41, the semiconductor wafer 120 is supported by contact with the bottom of the fitting groove 124A, almost centered therein (contact point A in FIG. 41). When the semiconductor wafer 120 is shaken, the position of the inner end of the contact piece 124 supported by the stronger elastic force of the connecting plate 125 does not change as much as the position of the external end supported by the weaker elastic force of the elastic support plate 123, so that, as shown by an imaginary line in FIG. 41, the semiconductor wafer 120 is moved toward the inner end side (contact point B side in FIG. 41) on the bottom of the fitting groove 124A. Therefore, when the force tending to displace the semiconductor wafer 120 is small (the amount of deflection of the wafer presser 121 is small), the outer end side (contact point A side in FIG. 41) of the semiconductor wafer 120 comes into contact with the bottom of the fitting groove 124A and is supported with the weaker elastic force. When the amount of force tending to displace the semiconductor wafer 120 increases (the deflection amount of the wafer presser 121 increases), the contact point of the semiconductor wafer 120 moves toward the inner end (contact point B side in FIG. 41) of the fitting groove 124A and the semiconductor wafer 120 is supported with the stronger elastic force. Further, as the amount of movement toward the inner end by the contact point of the semiconductor wafer 120 increases, the force applied to the connecting plate 125 increases more than that applied to the elastic support plate 123, so that movement of the semiconductor wafer 120 is efficiently suppressed.

A supporting rib 126 in the form of opposed support walls 129 and 130 serves to support the support plate 125 to prevent the connecting plates 125 from deviating from their positions in a direction parallel to the bottom surface of the lid unit. The supporting rib 126 is provided in the center of recess 33, as shown in FIGS. 34 to 40. The supporting rib 126 has a length sufficient to accommodate all of the plates 125 of a number corresponding to the number of the semiconductor wafers 120 to be housed.

The supporting walls 129 and 130 of rib 126 face and are parallel to each other. Each of the supporting walls 129 and 130 has a supporting plate piece 133 and a partition plate piece 134.

The supporting plate pieces 133 receive and support the vertical plate sections 125A and 125B of the connecting plates 125 so to hold them against deviation from their set circumferential positions relative to the semiconductor wafers 120 (the lateral direction in FIG. 40). The supporting plate pieces 133, by directly contacting and supporting the vertical plates 125A and 125B of the connecting plates 125, thereby indirectly support the contact pieces 124 against deviation from their circumferential positions relative to the semiconductor wafer 120.

The partition plate pieces 134 serve to receive and space the connecting plates 125. The partition plate pieces 134 are positioned outward of and extend between the adjacent connecting supporting plates 125 and thereby support each of the connecting plates 125 from both opposing sides. The partition plate pieces 134, by directly contacting and supporting the connecting plates 125, indirectly support the contact pieces 124 against deviation in position in a direction orthogonal to the circumference of the semiconductor wafers 120.

By sandwiching the connecting plates 125 between the supporting plate pieces 133 and the partition plate pieces 134, the connecting plates 125 are held against deviation from their positions in a direction parallel to the inner surface of the lid unit, while allowing for movement in a direction perpendicular to the inner surface of the lid unit.

The supporting plate pieces 133, the partition plate pieces 134 and the connecting plates 125 are arranged so as to have a small gap therebetween, thereby preventing contact with each other upon receipt of a small shaking force by the container. Thus, when a semiconductor wafer 120 is shaken slightly, the connecting plate 125 is deflected without coming into contact with the supporting plate piece 133 or the partition plate piece 134, thereby absorbing the shaking force. When the shaking becomes harder, the connecting plate 125 contacts and is supported by the supporting plate piece 133 and the partition plate piece 134.

Between each pair of supporting walls 129 and 130 of the supporting ribs 126, as shown in FIG. 34 and FIGS. 37 to 39, is a previously described support bar 131. The support bar 131 is in direct contact with and supports the connecting plates 125. Specifically, the center portion of each horizontal section 125C of the connecting plates 125 is in contact with and supported by the support bar 131, while both ends of the horizontal plates 125C can be freely deflected. The support bar 131 is centered between the two supporting walls 129 and 130 in parallel therewith, and its length is approximately the same as that of the supporting walls 129 and 130.

Figure 38:
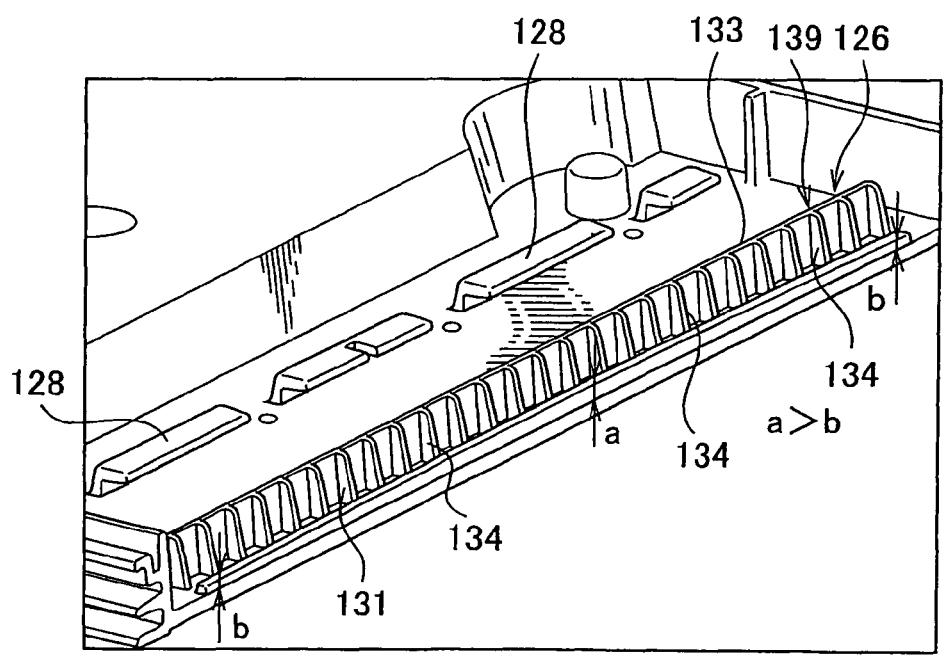
FIG. 38 is a partial perspective view showing the back face of the lid unit according to the second embodiment of the invention in a state where the wafer presser is removed.
Figure 39:
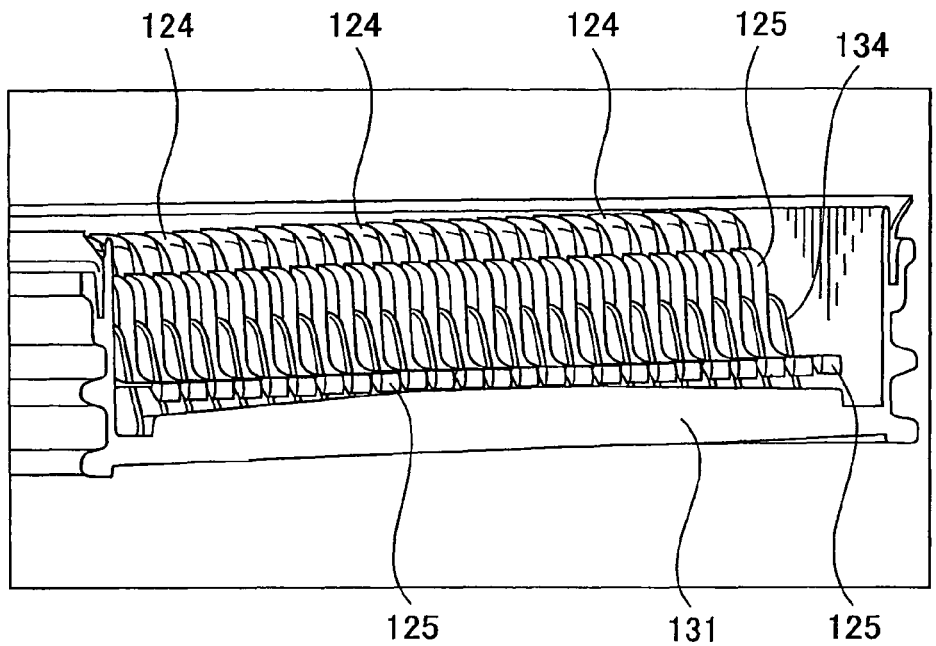
FIG. 39 is a perspective view showing a section of a supporting rib according to the second embodiment of the invention.

As shown in FIGS. 38 and 39 the height (thickness) of bar 131 is greatest in the center "a" and tapers, i.e. thins to dimension "b," at both ends, thereby causing the contact pieces 124 positioned in the center of support bar 131 to project further toward the semiconductor wafers 120 than the contact pieces 124 positioned at both ends. Thus, the support bar 131 is arched overall whereby, as shown in FIG. 39 the gap between the support bar 131 and the connecting plates 125 is wide at both ends and narrow in the center. Specific dimensions of the support bar 131 are properly set in accordance with the amount of deflection of the lid unit 127.

The support bar 131 is formed as described above for the following reasons. When the lid unit 127 is attached with a plurality of semiconductor wafers 120 housed in the container body 12, the lid unit 127 receives a reaction force from the wafer presser 121 when it presses against the semiconductor wafers 120 with a certain force. Consequently, the larger the force of supporting the semiconductor wafers 120 becomes in association with increase in the diameter of the semiconductor wafers 120 or within an increase in the number of the semiconductor wafers 120, the larger the reaction force on the wafer presser 121 becomes. Due to the forces of reaction on the lid unit 127 to which the wafer presser 121 is attached, the lid unit 127 is slightly deflected outward. When the lid unit 127 is deflected outward, the support of the semiconductor wafers 120 by the force of the wafer presser 121 becomes disproportionately weaker in the center portion. The purpose of the support bar is to solve this lack of uniformity of force supporting the semiconductor wafers 120. In other words, the support bar 131, which has a thicker center portion, compensates for deflection of the lid unit 127 and the wafer presser 121 thereby supports the semiconductor wafers 120 with uniform force.

In use, when the lid unit 127 is attached with a plurality of semiconductor wafers 120 housed in the container body 12, the wafer presser 121 engages the semiconductor wafers 120. Specifically, the fitting groove 124A in each of the contact pieces 124 is fitted over the periphery of a semiconductor wafer 120, and the periphery of the semiconductor wafer 120 is guided to the base (bottom) of the fitting groove 124A. Once the periphery of the semiconductor wafer 120 has become lodged within the second stage of the groove, a wide area of the semiconductor wafer 120 is in contact with the groove and the wafer 120 is supported with reliability. Each of the contact pieces 124, in turn, is supported by an elastic support plate 123 and a connecting plate 125.

The elastic support plate 123 elastically supports one end of each of the contact pieces 124 at its distal end while its base-end is fixed to an end support which is, in turn, fixed to the inner face of the lid unit 127. The connecting plate 125 elastically supports the inner end of the contact piece 124.

Further, the arched support bar 131 supports the contact pieces 124 while compensating for deflection of the lid unit 127. Accordingly, the contact pieces 124 support the semiconductor wafers 120 with uniform force.

The inner end of each of the contact pieces 124 is elastically supported by a relatively strong force and the outer end is elastically supported by a relatively weaker force. With the contact pieces 124 in contact with the semiconductor wafer 120 at the bottom portion of the fitting groove 124A which is tangential to the periphery of the semiconductor wafer 120, the elastic forces of the two contact pieces 124 are automatically adjusted to equalize the forces pressing the semiconductor wafer 120. In this manner, the semiconductor wafer 120 is stably supported.

When the thin plate supporting container is shaken during transportation, the semiconductor wafers 120 and the contact pieces 124 are also shaken. When the force of the shaking is small, the amplitude of each of the contact pieces 124 is small, so that the contact point between the semiconductor wafer 120 and the contact piece 124 is on the outer side (for example, around the contact point A in FIG. 41), the elastic supporting plate 123 is deflected, and the semiconductor wafer 120 is supported by a weak elastic force.

On the other hand when the shaking is large, the amplitude of the contact piece 124 is large, so that the contact point between the semiconductor wafer 120 and the contact piece 124 is shifted to the inner side (for example, to the contact point B in FIG. 41). According to the amount of shift, the force applied by the connecting plate 125 becomes larger than that applied by the elastic support plate 123, and overall the elastic force increases. Consequently, when the semiconductor wafer 120 is subjected to a large shaking force, the contact piece 124 pushes the semiconductor wafer 120 with a strong elastic force, thereby suppressing the shaking of the semiconductor wafer 120. In such a manner, according to the strength of shaking force, the force supporting the semiconductor wafer 120 is automatically changed to support the semiconductor wafer 120 with reliability.

As a result, all of the semiconductor wafers 120 are supported with uniform force, the shaking of the semiconductor wafers can be minimized, and the semiconductor wafers 120 can be prevented from canting (rotating).

Figure 25:
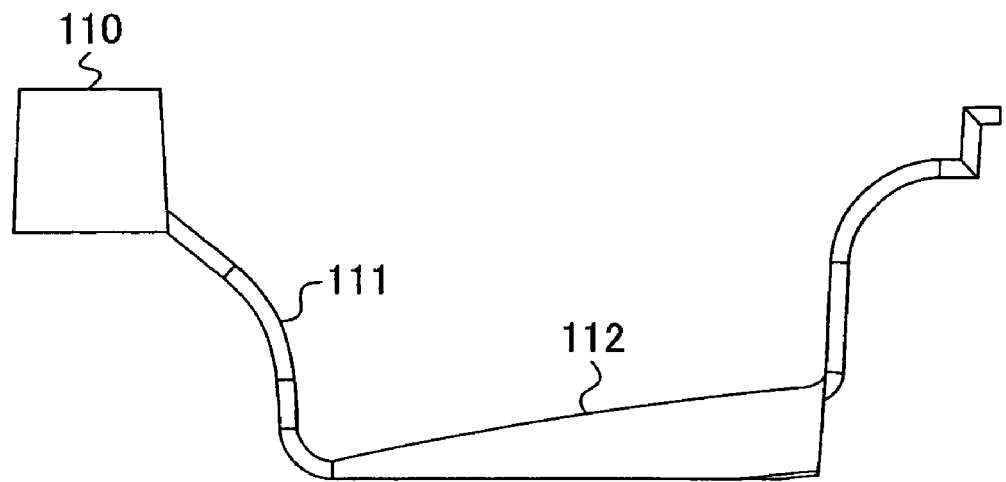
FIG. 25 is a side view of the wafer holder according to a first modification of the first embodiment of the invention.
Figure 26:
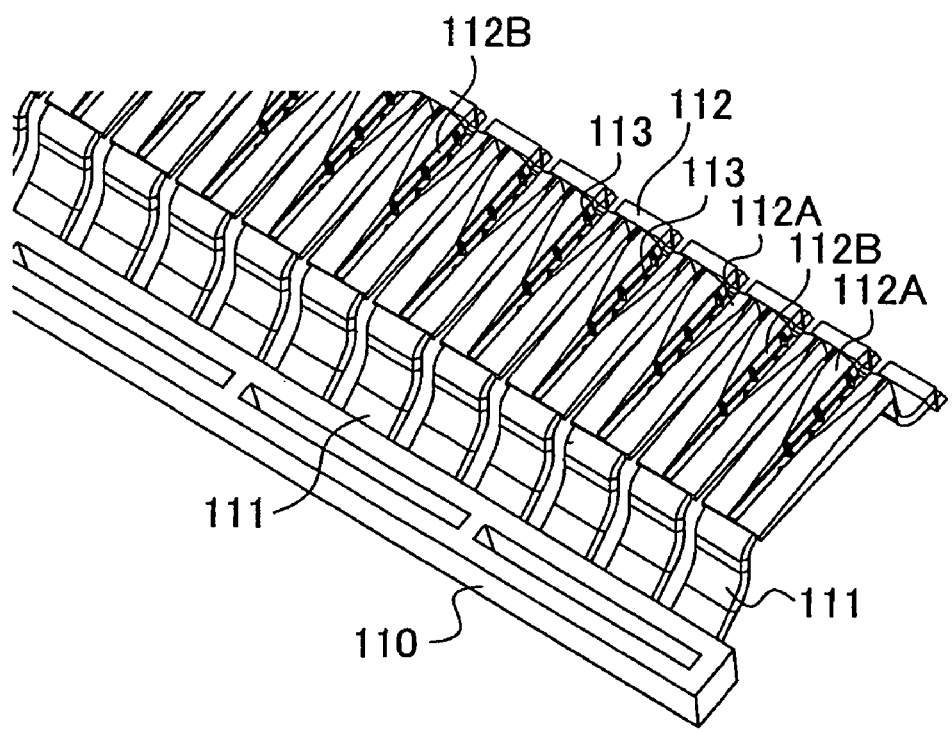
FIG. 26 is a perspective view showing the wafer presser according to the first modification of the first embodiment of the invention.
Figure 27:
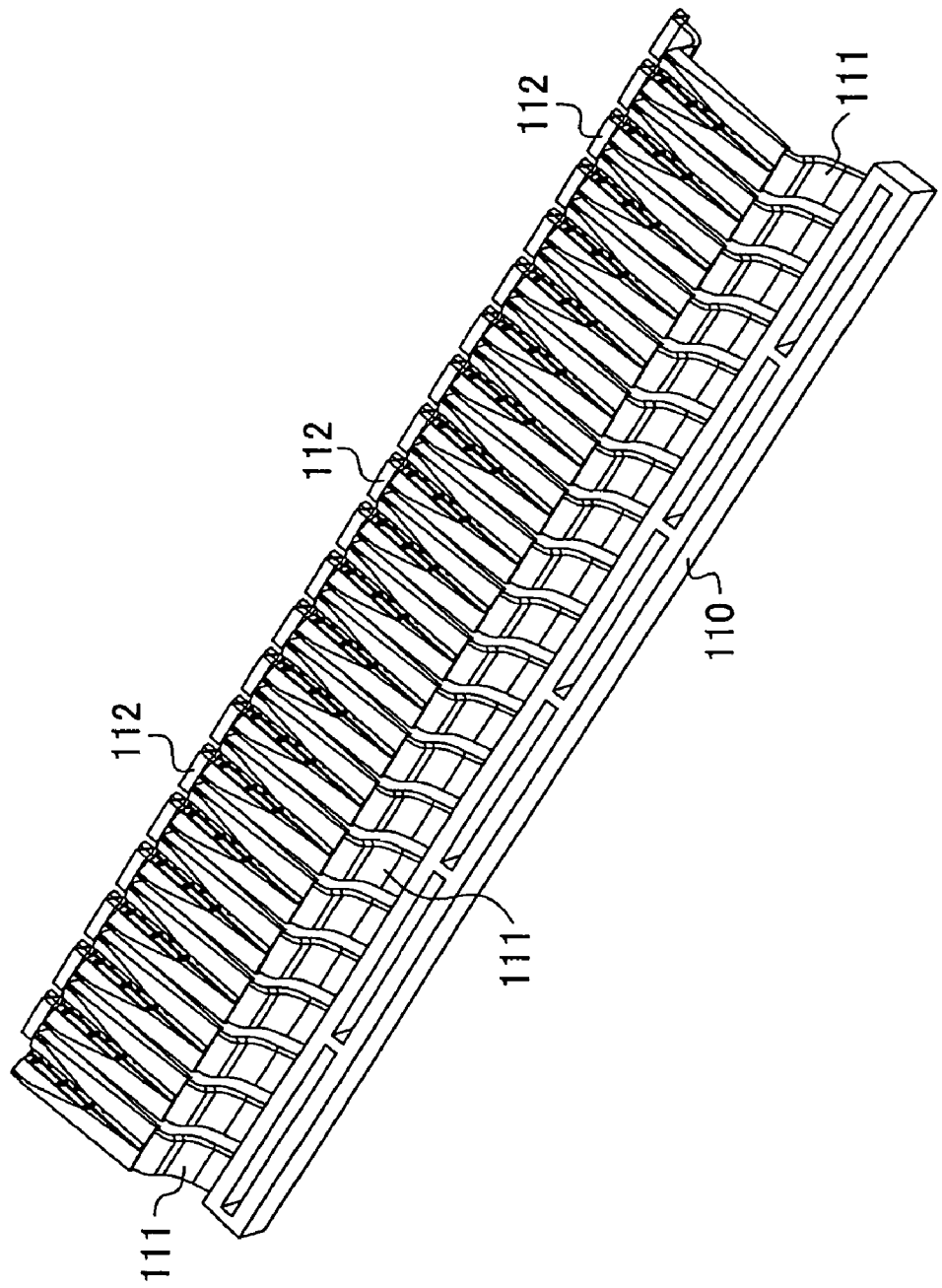
FIG. 27 is a perspective view showing the wafer presser according to the first modification of the first embodiment of the invention.

Modifications (1) In the first embodiment, the wafer presser 91 is formed of the end support 92, elastic support plate 93, and contact piece 94. In a modification, as shown in FIGS. 25, 26, and 27, the wafer presser is formed as an end support 110, an elastic support plate 111, and a contact piece 112. The elastic support plate 111 supports one end of the contact piece 112 with the base-end of the elastic support plate 111 fixed to the end support 110. Further, the elastic support plate 111 extends from the other end of the contact piece 112 to the bottom surface of the lid unit 15. The inclined surface 112A and contact surface 112B of the contact piece 112 have functions similar to those of the inclined surface 96A and the contact surface 96B, respectively, of the previous embodiment. Three supporting pawls 113 on the inclined face 112A and three supporting pawls 113 on the contact face 112B are disposed so as to face each other. The number of the supporting pawls 113 may be changed if necessary.

Figure 28:
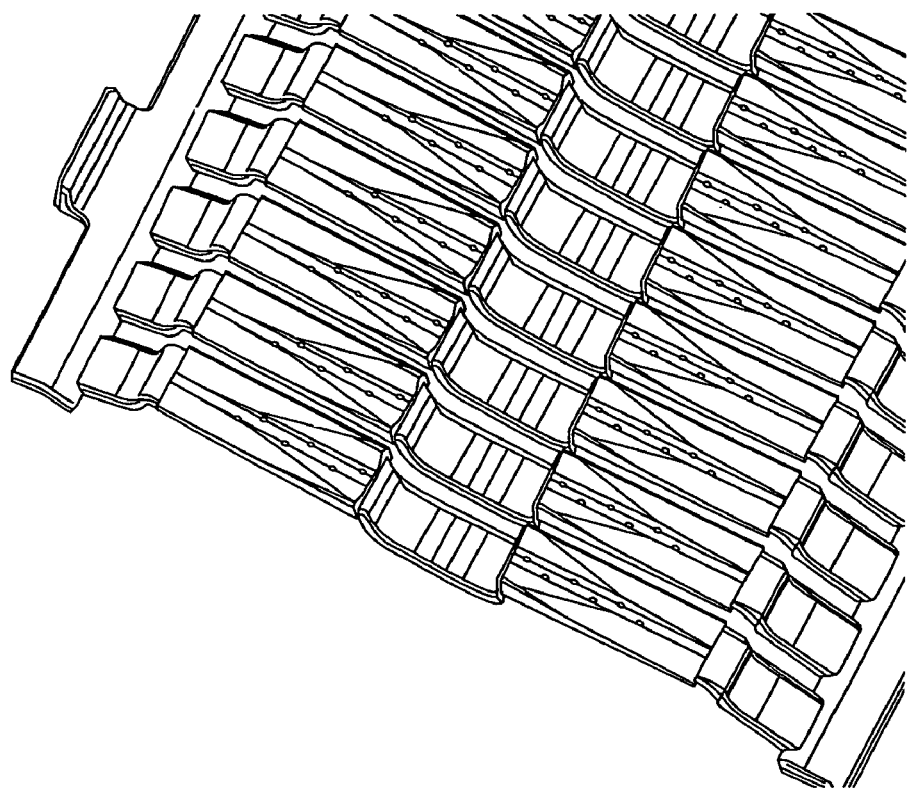
FIG. 28 is a perspective view showing the wafer presser according to a second modification of the first embodiment of the invention.
Figure 29:
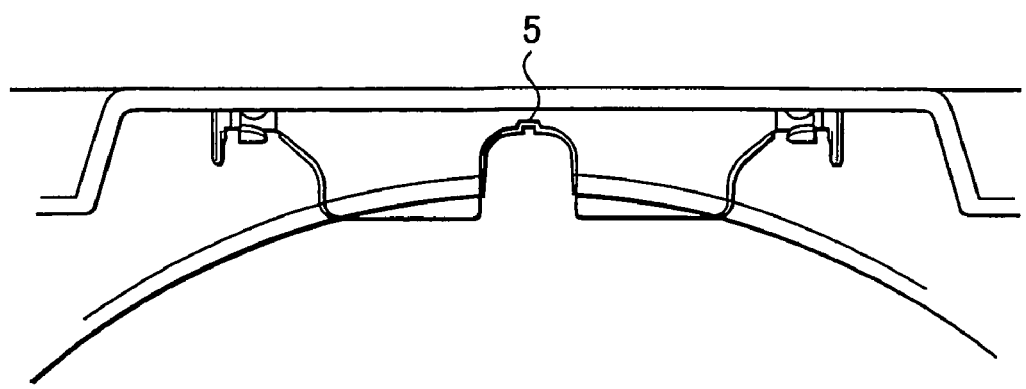
FIG. 29 is a front view showing the wafer presser according to the second modification of the first embodiment of the invention.

(2) Although the wafer presser 91 has a one-sided supporting structure in the first embodiment, as shown in FIGS. 28 and 29, it can also have a two-sided supporting structure. The elastic supporting plate is attached between and on both sides of the contact pieces so as to support the contact pieces in a manner where the elastic supporting plate between the contact pieces "floats", slightly spaced from the bottom surface of the lid unit 15 only by a gap S.

Since the contact pieces are supported by the elastic supporting plate between the contact pieces in a state slightly spaced from the lid surface, a thin plate is supported by a force which is normally relatively weak. When a large shock is received, for example, where the thin plate supporting container is dropped by mistake, the gap S disappears, and the elastic supporting plate between the contact pieces comes into contact with the supporting face (lid surface) and accordingly support of the contact pieces is greatly increased. In this manner, the thin plates are protected from a strong shock.

Figure 30:
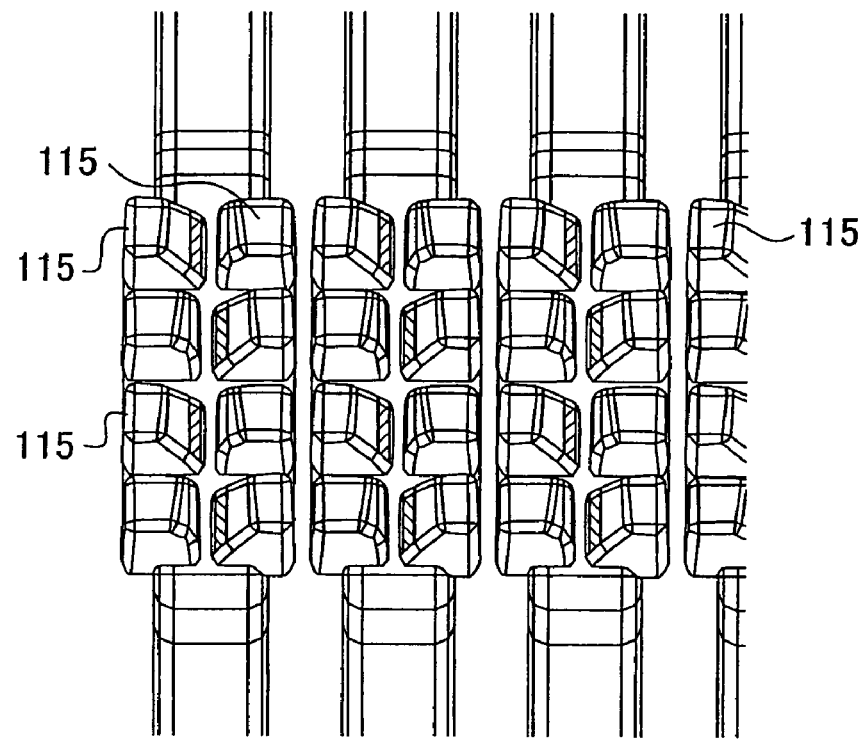
FIG. 30 is a perspective view showing the wafer presser according to a third modification of the first embodiment of the invention.
Figure 31:
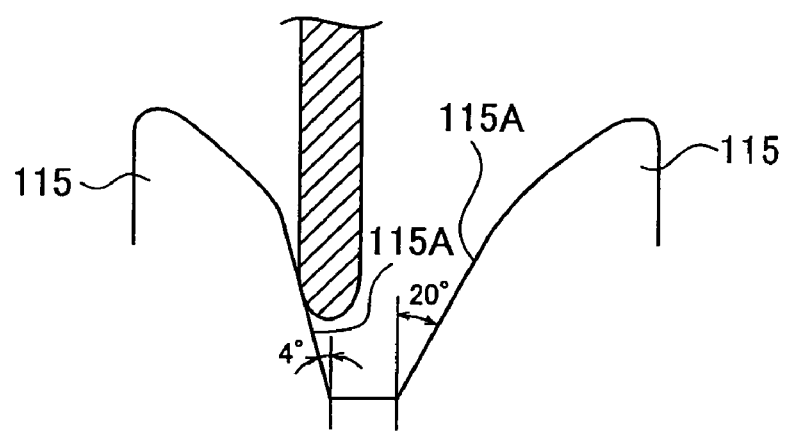
FIG. 31 is a cross section of a main portion showing the wafer presser according to the third modification of the first embodiment of the invention.

(3) While the semiconductor wafers are supported by the supporting pawls 97 in the above first embodiment, they may be supported by blocks. As shown in FIGS. 30 and 31, blocks 115 are alternately disposed facing each other. That is, four sets of blocks 115 are arranged at spaced intervals. Further, the contact surfaces 115A for a set of blocks 115 are set at 20° and 4° with the vertical. The contact surface 115A on the side which contacts the semiconductor wafer is set to 4°. By sandwiching the periphery of a semiconductor wafer between the blocks with the 4° angle (8° total), the semiconductor wafer can be reliably supported.

Figure 32:
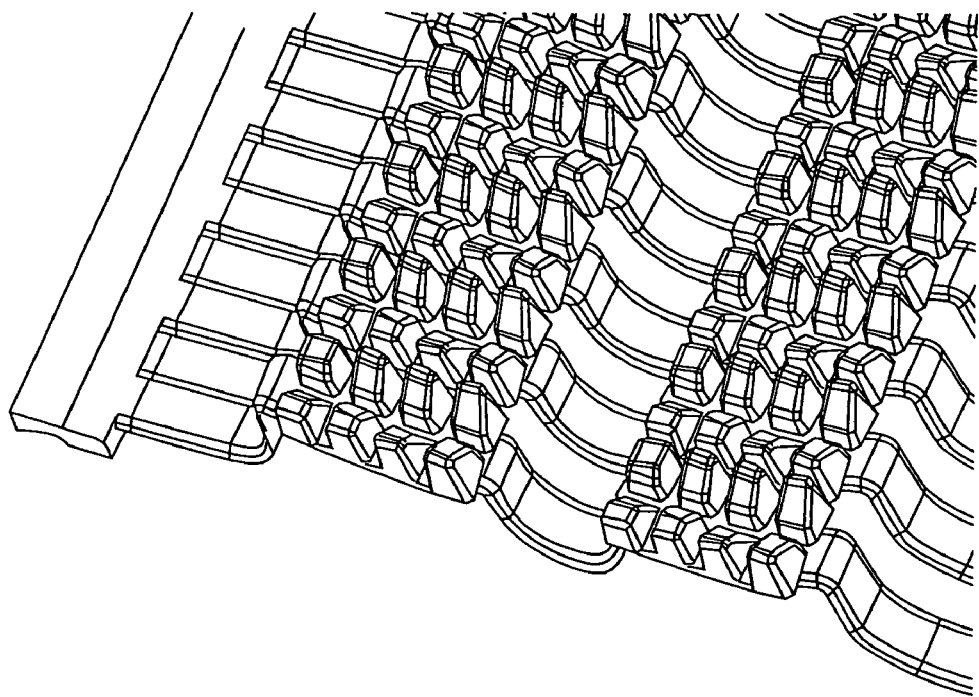
FIG. 32 is a perspective view showing a wafer presser according to a fourth modification of the first embodiment of the invention.
Figure 33:
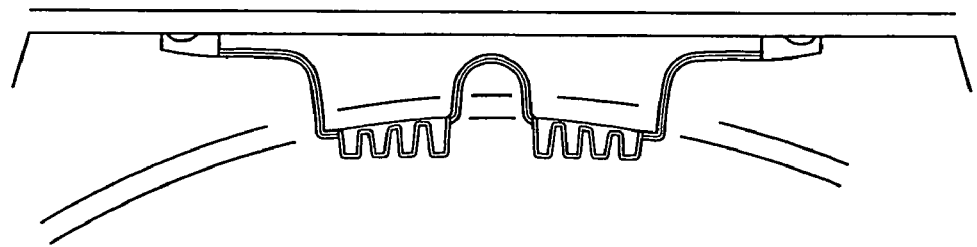
FIG. 33 is a front view showing the wafer presser according to the fourth modification of the first embodiment of the invention.
Figure 34:
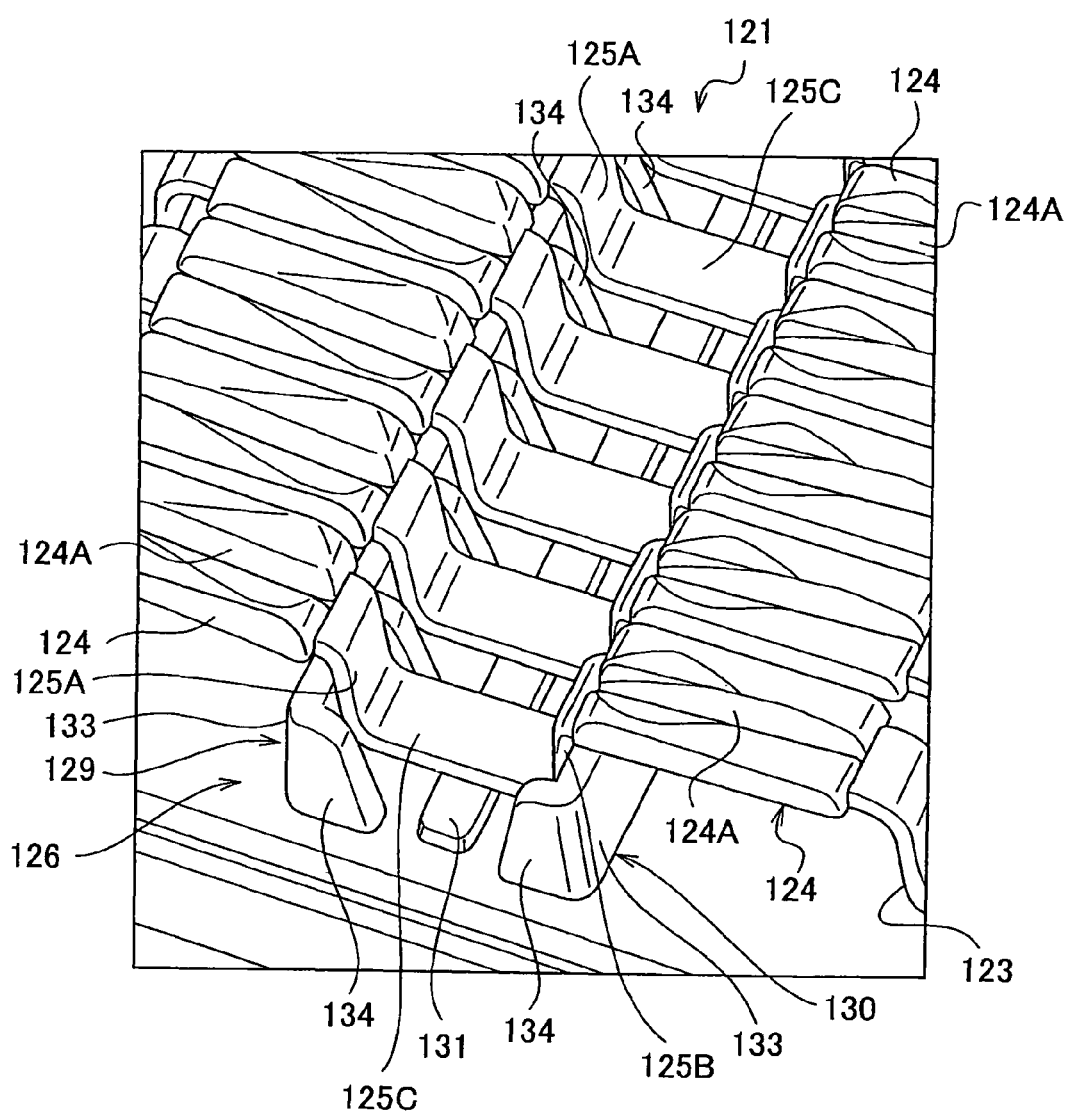
FIG. 34 is a perspective view of a main portion of the wafer presser according to a second embodiment of the invention.
Figure 35:
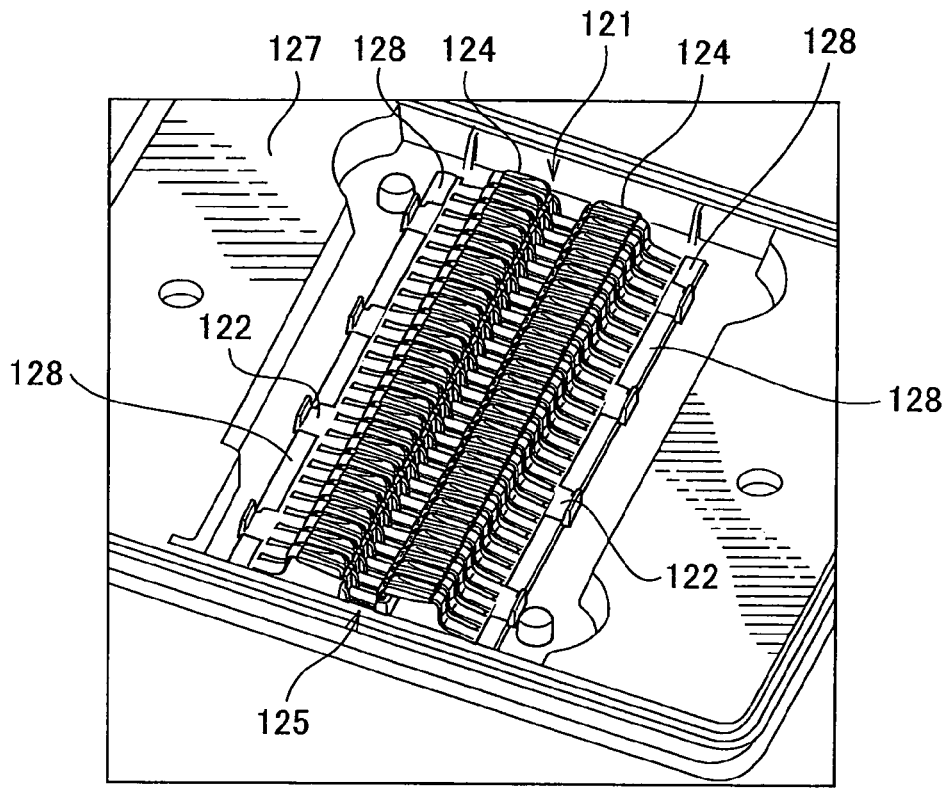
FIG. 35 is a perspective view showing the back face of the lid unit including the wafer presser according to the second embodiment of the invention.
Figure 36:
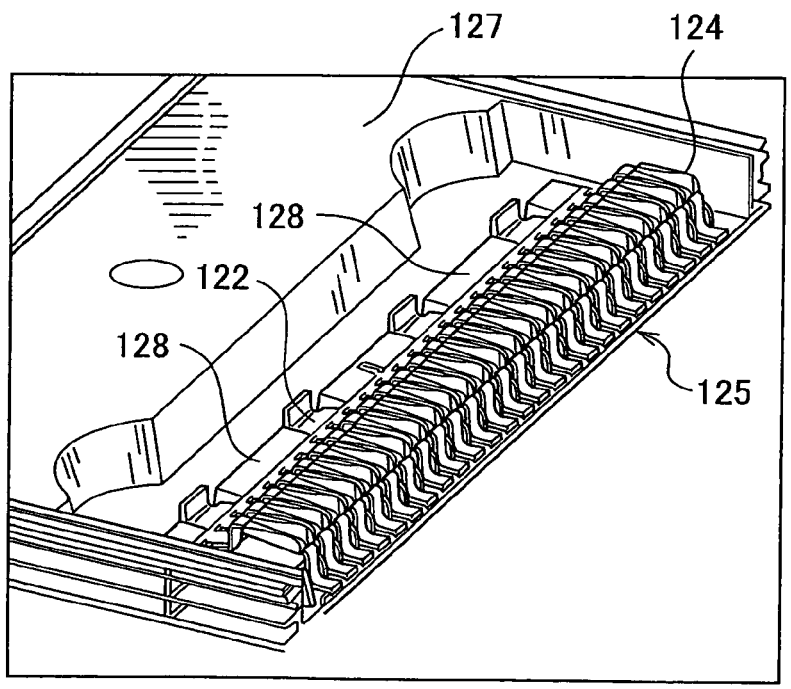
FIG. 36 is a partial perspective view showing the back face of the lid unit including the wafer presser according to the second embodiment of the invention.
Figure 37:
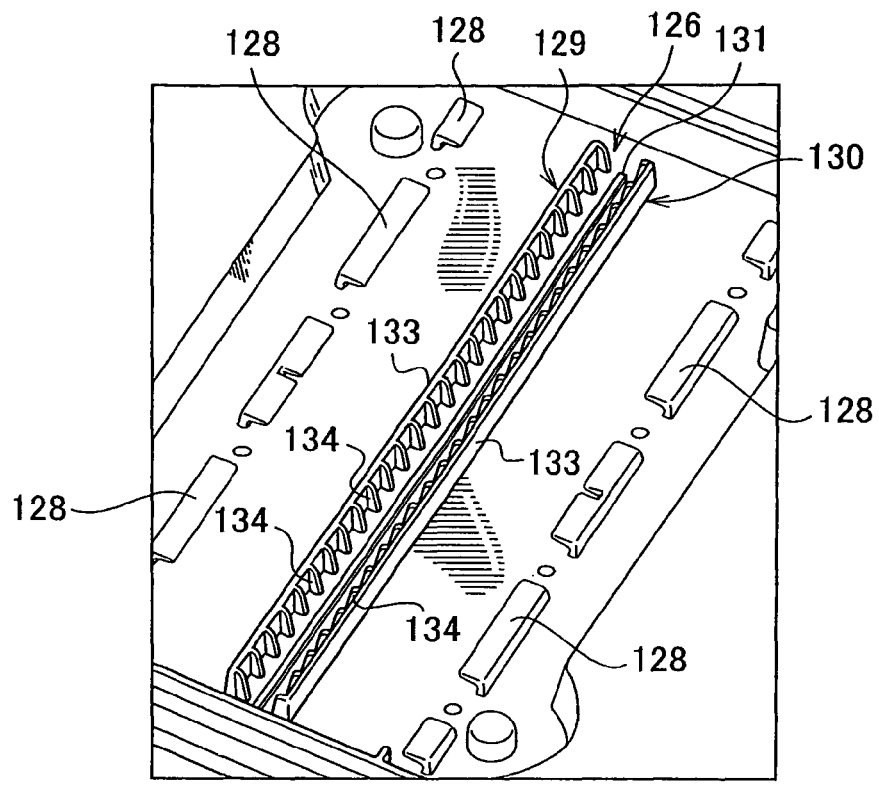
FIG. 37 is a perspective view of a main portion showing the back face of the lid unit according to the second embodiment of the invention in a state where the wafer presser is removed.

Alternatively, the blocks may be arranged as shown in FIGS. 32 and 33, with effects similar to those described with reference to FIGS. 28 and 29.

(4) Although the lid unit has been described as intended to be used in a manufacturing line, the lid unit can be also used for storage, transport, and the like.

(5) Although two simple latching mechanisms 32 are provided on the lid unit 15 of the first embodiment, the number of the latching mechanisms 32 may be one or three to meet a given standard.

(6) Although the lid unit has been described as closing a container housing semiconductor wafers, i.e. the first embodiment, the lid unit can be applied not only to a container for housing semiconductor wafers but also to a container for housing other thin plates.

(7) In the first embodiment and its modifications, the wafer presser is applied to the thin plate supporting container 11. However, the invention is not limited to the thin plate supporting container 11 but can be also applied to thin plate supporting containers having other structures.

(8) Although the lid unit holder 100 is applied to the thin plate supporting container 11 in the first embodiment, the invention is not limited to such a thin plate supporting container. The lid unit holder 100 can be also applied to thin plate supporting containers having other structures.

(9) Although two contact pieces 124 are provided on each set of supports of the wafer presser 121 in the second embodiment, three or more contact pieces 124 may be provided. With provision of three or more contact pieces 124, the connecting plate 125 and the supporting rib 126 are provided between the neighboring contact pieces 124.

(10) In the second embodiment, the horizontal plates 125C are supported by the support projection bar 131. Alternatively, a supporting projection may be provided in the center of the horizontal plate 125C and the support bar 131 may be omitted. In embodiments including the support 131, the horizontal plates 125C are supported by coming into contact with the support bar 131. In embodiments including where the support bar 131 is omitted, the projections of the horizontal plates 125C support same by coming into contact with the inner face of the lid unit 127.

In embodiments where the support bar 131 is omitted, the heights of the supporting projections of the horizontal plates 125C are greater in the center of the wafer presser than at the ends as in the second embodiment. In embodiments including both the support bar 131 and supporting projections in the center portions of the horizontal plates 125C, the support bar 131 may have its center portion higher, tapering toward thinner ends, as in the second embodiment.

(11) Although the fitting groove 124A of the contact pieces 124 is formed in a V shape in the second embodiment, like the contact piece 94 in the first embodiment, in the second embodiment also support pieces alternately disposed may be provided. That is, the contact pieces 124 of the second embodiment may be constructed like the contact pieces 94 of the first embodiment, in the form of two blocks 96 and the alternately disposed supporting pawls 97 (supporting pieces). With this structure, the alternately disposed supporting pieces are in contact with the periphery of the semiconductor wafer 120, so that the semiconductor wafer 120 is supported with reliability. As a result, shaking of the semiconductor wafer 120 caused by vibrations from exterior causes can be minimized. In addition, the semiconductor wafer 120 can be more reliably prevented from canting.

(12) The structure for supporting the contact piece 124 of the wafer presser 121 is not limited to that of the second embodiment but may be any structure so long as the contact piece 124 positioned in the center is disposed so as to project further toward the semiconductor wafers 120 as compared with the contact pieces positioned on both sides.

For example, the elastic supporting plate 123 may be formed so as to dispose the contact piece 124 positioned in the center projects further toward the semiconductor wafers 120, as compared with the contact pieces 124 positioned on both sides thereof. Any one of the elastic supporting plate 123 and the connecting and supporting plate 125 or both may be formed so as to dispose the contact piece 124 which is positioned in the center to project further toward the semiconductor wafers 120 as compared with the contact pieces 124 positioned on opposing sides thereof.

Figure 44:
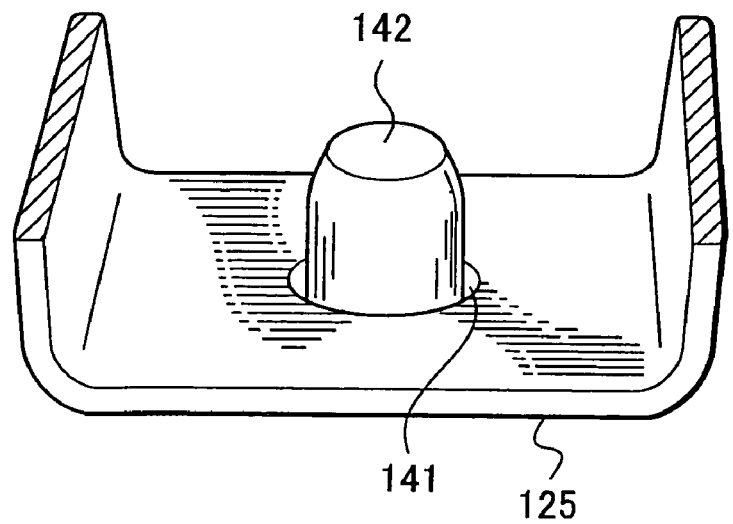
FIG. 44 is a perspective view of a main portion showing a modification of the second embodiment of the invention.

(13) Although the connecting plates 125 are supported by the supporting ribs 126 in the second embodiment, alternatively they can be supported by projections. Specifically, as shown in FIG. 44, the connecting plate 125 may be supported by a projection 142 which is seated in a fitting hole 141 formed in the connecting and supporting plate 125, thereby preventing deviation from the appropriate position of plate 125 relative to (parallel to) the inner surface of the lid unit, while allowing buffering movement in a direction perpendicular to the inner surface of the lid unit.

Figure 45:
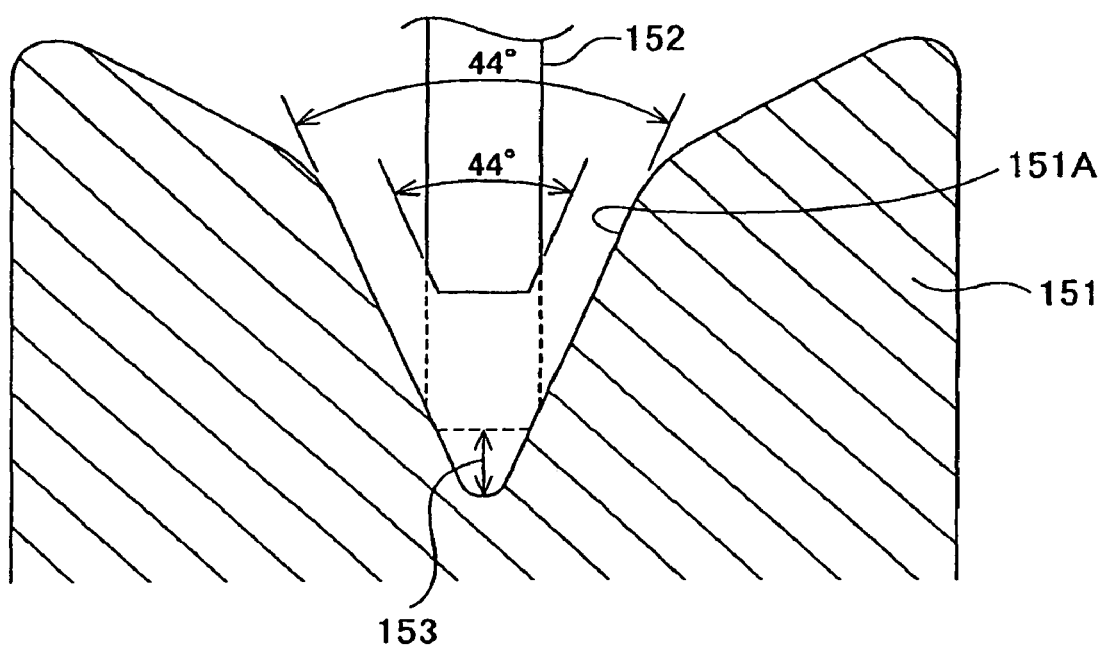
FIG. 45 is a cross-section view of a modification of the second embodiment of the invention

(14) Although the bottom of the V-shaped fitting groove 124A of the contact piece 124 is formed as a flat surface having a width which is almost the same as the thickness of the semiconductor wafer 120 in the second embodiment, the bottom may be thinner as shown in FIG. 45. Further, although contact piece 151 is described as including a V-shaped groove 151A having an angle of inclination of 44°, the same as the edge angle 44° of the periphery of the semiconductor wafer 152, and the V-shaped groove 151A has two stages of angle, the angle may be one stage.

The bottom of the V-shaped groove 151A is formed narrower than the thickness of the semiconductor wafer 152. In such a manner, a gap 153 is formed between the periphery of the semiconductor wafer 152 and the bottom of the V-shaped groove 151A when the semiconductor wafer 152 is completely seated in the V-shaped groove 151A, so that the semiconductor wafer 152 is supported by the inclined surfaces of the V-shaped groove 151A. Since both the angle of the beveled periphery of the semiconductor wafer 152 and the angle of inclination of the V-shaped groove 151A of the contact piece 151 are 44°, the periphery of the semiconductor wafer 152 and the inclined surface of the V-shaped groove 151A are in contact over a large area.

Because the gap 153 is present between the periphery of the semiconductor wafer 152 and the bottom of the V-shaped groove 151A, the periphery of the semiconductor wafer 152 is not directly supported. As a result, the periphery of the semiconductor wafer 152 is wedged into and strongly pressed against the V-shaped groove 151A. As a result, the semiconductor wafer 152 can be supported by the contact piece 151 of the thin plate presser without too strongly pressing the contact piece 151 of the thin plate presser against the semiconductor wafer 152, but with sufficient force so that canting (rotation) of the semiconductor wafer 152 caused by vibration and the like can be prevented. Consequently, the semiconductor wafer 152 can be reliably supported without too strongly pressing the lid against the container body. This structure eliminates the need to increase lid strength and facilitates automatic attaching and detaching of the lid.

When the angle of the V-shaped groove 151A of the contact piece 151 is from 20° to 60°, advantages similar to those of the above embodiment are achieved. When the semiconductor wafer 152 is fit in a V-shaped groove 151A having an angle from 20° to 60°, the semiconductor wafer 152 is supported and attached/detached surely and easily. When the angle of the V-shaped groove 151A is 60°, the semiconductor wafer 152 will be only slightly moved upon vibration by external force. However, when the angle of inclination of the V-shaped groove 151A exceeds 60°, the semiconductor wafer 152 will excessively move (rotate) upon vibration by external force.

When the angle of inclination of the V-shaped groove 151A is less than 20° and an attempt is made to separate the contact piece 151 from the semiconductor wafer 152, the semiconductor wafer 152 may catch in the V-shaped groove 151A and strongly resist being pulled out. However, when the angle of inclination of the V-shaped groove 151A is 20°, the semiconductor wafer 152 is only lightly retained in the V-shaped groove 151A and may be smoothly removed.

Therefore, it is desirable to set the angle of inclination of the V-shaped groove 151A at 20° to 60°. Given an angle within this range, the semiconductor wafer 152 can be seated within the V-shaped groove 151A and secured against movement relative to the wafer presser, yet can be smoothly separated therefrom. As a result, the semiconductor wafer 152 can be supported with reliability. In addition, it is easy to attach and detach the lid and automate the operations of attaching and detaching the lid.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

We claim:

1. A lid unit for closing a container body of a portable thin plate supporting container in which a plurality of thin plates are housed, said lid unit comprising:
   a thin plate presser, fixed to an inner surface of said lid unit, for supporting a plurality of thin plates housed in the container body,
   wherein the thin plate presser comprises:
   two base end supports fixed in parallel to an inner surface of the lid unit;
   a plurality of contact pieces each of which comes into direct contact with a periphery of a thin plate;
   a plurality of elastic support plates extending from and supported by each of the base end supports, the elastic support plates extending from one of the base end supports being respectively paired with opposing elastic support plates extending from the other base end support, each of the paired support plates having distal ends connected to and supporting outer ends of said contact pieces, with plural contact pieces arranged between the distal ends of each pair of opposing support plates; and
   a plurality of connecting plates, each connecting plate connecting and supporting inner ends of the plural contact pieces between the distal ends of a pair of supporting plates.

2. A lid unit for a thin plate supporting container according to claim 1 wherein the plural contact pieces comprise:
   centrally positioned and parallel contact pieces and additional contact pieces disposed on opposing sides of the centrally positioned contact pieces and connected thereto in a linear array; and
   wherein the parallel centrally positioned contact pieces project further toward the thin plates than the additional contact pieces positioned on opposing sides of the centrally positioned contact pieces.

3. The lid unit for a thin plate supporting container according to claim 2, wherein the elastic support plates project the centrally positioned contact pieces further toward the thin plates than the additional contact pieces positioned on opposing sides of the centrally positioned contact pieces 4. The lid unit for a thin plate supporting container according to claim 2, wherein the elastic support plates comprise:
   a plurality of first elastic support plates supported by the end support and having distal ends supporting one end of each of the contact pieces; and
   a plurality of second elastic support plates supporting a second end of each of the contact pieces, and
   wherein at least said first or second elastic support plates are formed to project the centrally positioned contact pieces further toward the thin plates than the additional contact pieces positioned on both sides of said centrally positioned contact pieces and wherein the linear array becomes curved into an arch shape.

5. The lid unit for a thin plate supporting container according to claim 2, wherein the elastic support plates comprise:
   a plurality of first elastic support plates supported by one of the base end supports and having distal ends supporting one end of each of the contact pieces;
   a plurality of second elastic support plates supporting a second end of each of the contact pieces and contacting the inner surface of the lid unit; and
   a supporting projection bar, provided on the inner surface of the lid unit, for contacting the second elastic support plates to thereby support for the second elastic support plates, and
   wherein at least one of the supporting projection bar and the second elastic support plates project the centrally positioned contact pieces further toward the thin plates than the additional contact pieces positioned on opposing sides of the centrally positioned contact pieces.

6. The lid unit for a thin plate supporting container according to claim 2, wherein the contact pieces each have a V-shaped groove of 40° to 44° for receiving one of the thin plates.

7. The lid unit for a thin plate supporting container according to claim 1, further comprising:
   a supporting member on the inner surface of the lid unit for supporting the connecting plates while allowing movement of the connecting plates in a direction perpendicular to the inner surface of the lid unit,
   wherein the supporting member has supporting ribs for holding each of the connecting plates against movement along the inner surface of the lid unit.

8. The lid unit for a thin plate supporting container according to claim 7,
   wherein the supporting member has a fitting projection which is seated within a hole formed in the connecting plate, thereby preventing movement of the connecting plate relative to the inner surface of the lid unit while permitting movement in a direction perpendicular to the inner surface of the lid unit.

9. The lid unit for a thin plate supporting container according to claim 1,
   wherein elastic force of the connecting plates supporting the contact pieces is stronger than elastic force of the elastic support plates supporting the contact pieces.

10. The lid unit for a portable thin plate supporting container according to claim 1, wherein each of said contact pieces has a V-shaped groove for receiving the periphery of one of said thin plates, said V-shaped groove extending through an angle of from 20° to 60°.

11. The lid unit for a thin plate supporting container according to claim 10, wherein a gap is formed between the periphery of a thin plate and the bottom of the V-shaped groove when the thin plate is seated within the V-shaped groove.

12. The lid unit for a thin plate supporting container according to claim 1, wherein each of said contact pieces has a V-shaped groove defining an angle equal to the angle of bevel on the peripheries of the thin plates, and wherein a gap is formed between the periphery of a thin plate and the bottom of a V-shaped groove when the thin plate is seated in the V-shaped groove.

13. The lid unit for a thin plate supporting container according to claim 12, wherein the V-shaped groove of the contact piece extends through an angle of 44°.

* * * * *